(12) United States Patent
Hazelton et al.

(10) Patent No.: US 6,373,153 B1
(45) Date of Patent: Apr. 16, 2002

(54) STAGE DEVICE, AND EXPOSURE APPARATUS WITH LINEAR MOTOR HAVING POLYGONAL SHAPED COIL UNITS

(75) Inventors: Andrew J. Hazelton, San Carlos; Thomas W. Novak, Hillsborough, both of CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/679,289

(22) Filed: Oct. 6, 2000

Related U.S. Application Data

(63) Continuation of application No. 09/371,153, filed on Aug. 10, 1999, which is a continuation of application No. 09/059,056, filed on Apr. 10, 1998, now abandoned.

(51) Int. Cl.[7] .............................................. H02K 41/00
(52) U.S. Cl. .................................................... 310/12
(58) Field of Search ............................ 310/12, 13, 14

(56) References Cited

U.S. PATENT DOCUMENTS

| | | | |
|---|---|---|---|
| 4,460,855 A | 7/1984 | Kelly | 318/135 |
| 4,654,471 A | 3/1987 | Masaki et al. | 174/50 |
| 4,758,750 A | 7/1988 | Itagaki et al. | 310/13 |
| 4,767,954 A | 8/1988 | Phillips | 310/12 |
| 5,023,495 A * | 6/1991 | Ohsaka et al. | 310/12 |
| 5,197,180 A * | 3/1993 | Milhalko | 29/596 |
| 5,473,410 A | 12/1995 | Nishi | 355/53 |
| 5,528,118 A | 6/1996 | Lee | 318/568.17 |
| 5,874,820 A | 2/1999 | Lee | 318/575 |

FOREIGN PATENT DOCUMENTS

| | | |
|---|---|---|
| EP | 0 241 875 | 10/1987 |
| EP | 0 331 463 | 9/1989 |
| JP | 59-60885 | 4/1984 |
| JP | A 64-83264 | 3/1989 |
| JP | 64-83264 | 3/1989 |
| JP | A 8-166475 | 6/1996 |
| JP | A 8-330224 | 12/1996 |

OTHER PUBLICATIONS

Document No. 62–296763 (w/abstract) Dec. 24, 1987 Japan.
Document No. 1–268449 (w/abstract) Oct. 26, 1989 Japan.
Document No. 2–23057 (w/abstract) Jan. 25, 1990 Japan.
Document No. 4150760 (w/abstract) May 25, 1992 Japan.
Document No. 6–36336 (w/abstract) May 13, 1994 Japan.

* cited by examiner

*Primary Examiner*—Nestor Ramirez
*Assistant Examiner*—Judson H. Jones
(74) *Attorney, Agent, or Firm*—Oliff & Berridge, PLC

(57) ABSTRACT

The exposure apparatus of the present invention for forming a specified image on a substrate mounted on a substrate stage, has a linear motor as a part of a driving source for driving said substrate stage. The linear motor comprises: a magnet track; and a motor coil operating in cooperation with said magnet track and having a plurality of coil units, each of said coil units having an electrical conductor configured into a geometric polygonal shape defining a substantially planar conducting band surrounding a void, and wherein said plurality of coil units are arranged linearly.

15 Claims, 32 Drawing Sheets

FIG.4C
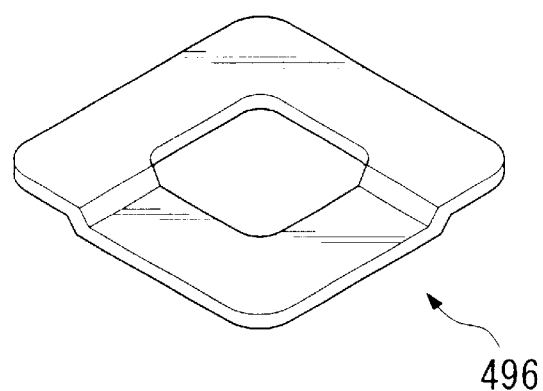
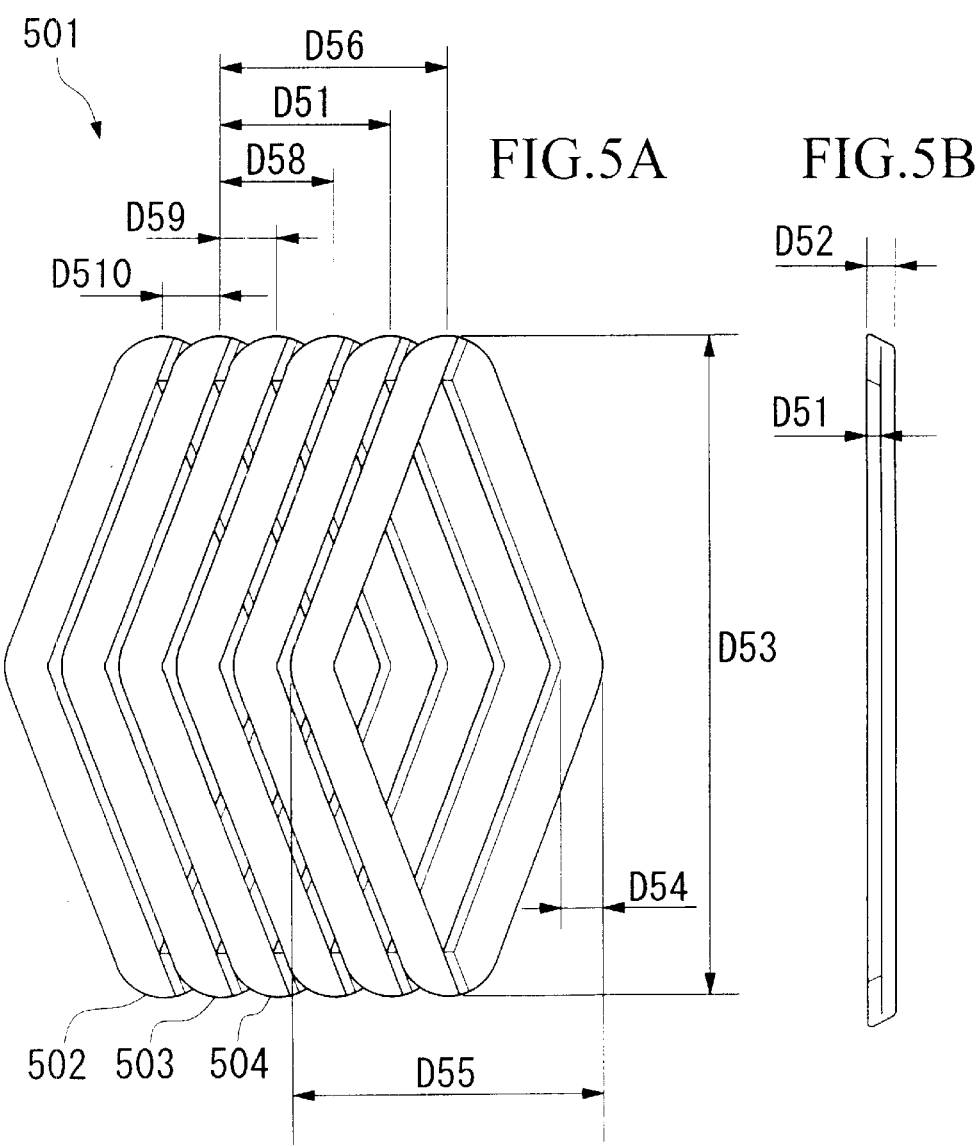
FIG.5A        FIG.5B

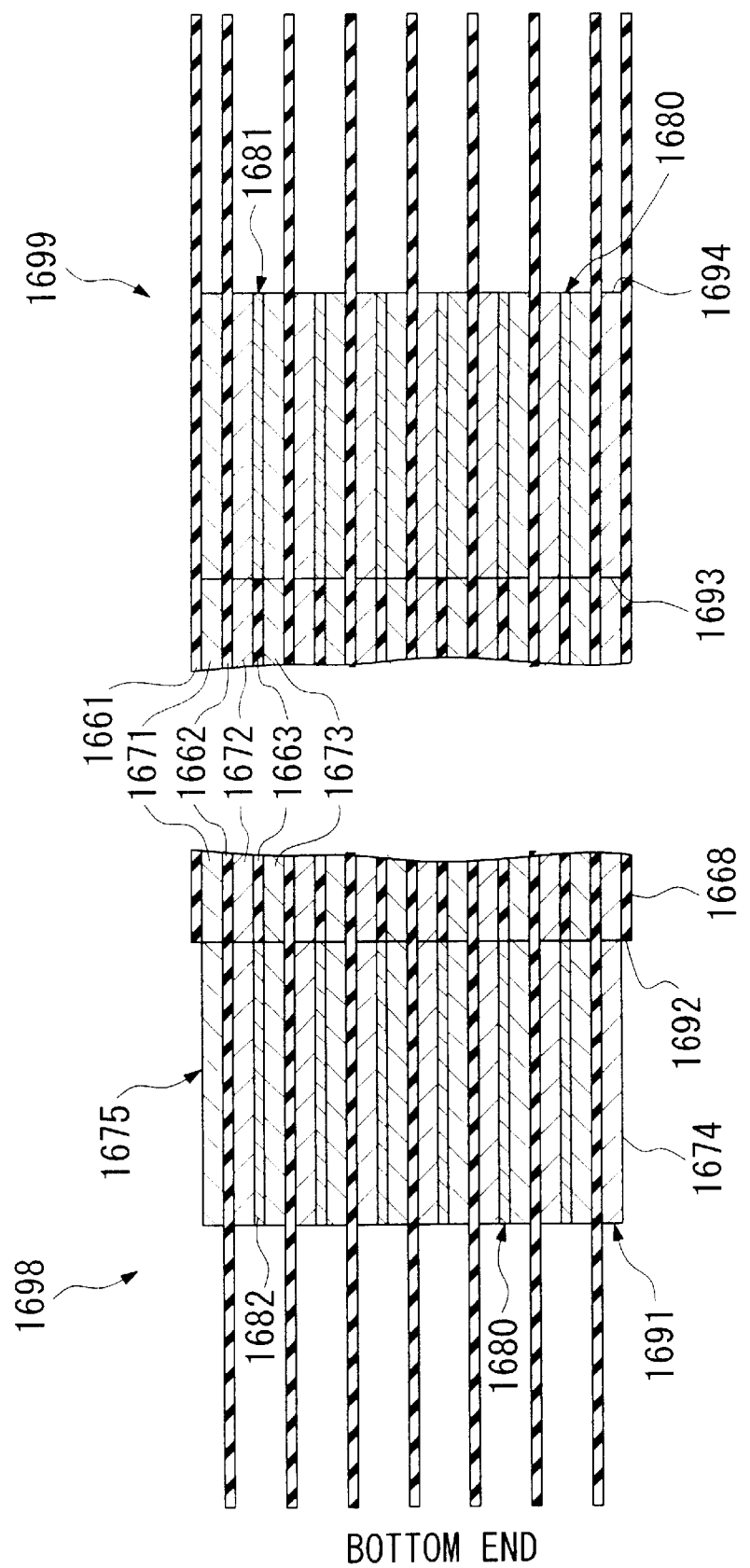

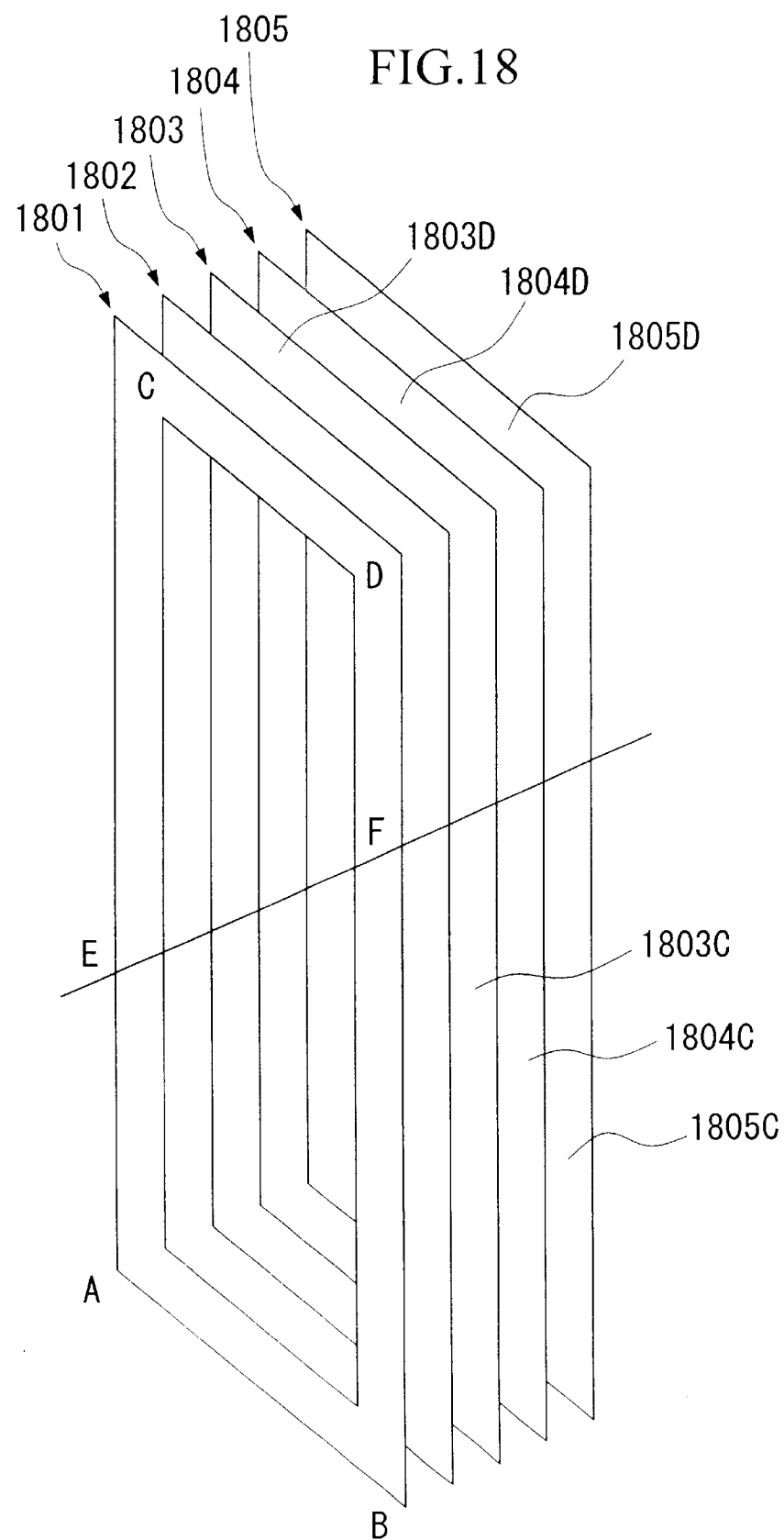

STAGE DEVICE, AND EXPOSURE APPARATUS WITH LINEAR MOTOR HAVING POLYGONAL SHAPED COIL UNITS

This application is a Continuation Application of U.S. application Ser. No. 09/371,153 filed Aug. 10, 1999, which in turn is a Continuation Application of U.S. application Ser. No. 09/059,056 filed Apr. 10, 1998 now abandoned.

FIELD OF THE INVENTION

This invention relates to stage devices and exposure apparatuses with high performance linear motors.

BACKGROUND

Linear motors are commonly used, for example, in microlithographic instruments for positioning objects such as stages, and in other precision motion devices. A linear motor uses electromagnetic force (normally called Lorentz force) to propel a moving part.

In FIG. 1A (reproduced from FIG. 1 of Itagaki et al. U.S. Pat. No. 4,758,750, incorporated herein by reference in its entirety) a conventional linear motor includes magnets 2 which form one magnet pair and create a magnetic field in between. The magnetic poles N (north) and S (south) are shown. Similarly, the adjacent magnets form another magnet pair and create a magnetic field of opposite polarity. The width of two adjacent magnets plus two spaces between the magnets defines the magnetic pitch PM of the motor. The magnetic flux direction across a gap 4 is indicated by arrows 7 and 7a. A moving coil unit 12 has electrically conductive wires laid out in a direction 4 perpendicular to the plane of the figure. An electric current is passed through the wires, in a direction either into the plane of the figure or out of the plane of the figure.

As those skilled in the art will recognize, a wire carrying an electric current in a magnetic field creates Lorentz force, the formula of which is:

$$F = N\,L\,B \times I$$

Where F represents Lorentz force, N the number of wires, B the magnetic flux, and I the electric current. For a coil with a given length L and magnetic flux B, to maximize force F, one has to maximize the number of wires N and current I. The above formula determines both the magnitude and the direction of force F, since force F, magnetic flux B, and current I are all represented as vectors, and the symbol "x" represents vector cross product multiplication. As those skilled in the art will recognize, a task in motor design is to maximize $F/\sqrt{P}$, or the "motor constant" where $$F/\sqrt{P} = NLBI/(\sqrt{I^2 R}) = NLB/\sqrt{R}$$

In the above expression, F is the scalar value of vector F, while P is the amount of power consumed by the motor. For each particular design configuration, the motor constant is directly related to the "copper density," which is defined as the total wire cross sectional area as a percentage of the entire coil cross section. (The coil wires are often made of copper.)

In the configuration shown in FIG. 1A, the Lorentz force created by the current in coil unit 12 causes the coil to move. While traveling in the right direction of FIG. 1A, coil unit 12 eventually leaves the field of magnets 2 and enters the field of the adjacent magnets. Since this second magnetic field has a reversed polarity relative to that of the first magnetic field, the current in coil unit 12 must reverse in polarity so as to maintain the direction of Lorentz force. The reversal of the direction of the electric current is accomplished by a commutation circuit familiar in the art (not shown).

FIG. 1B, reproduced from FIG. 2 of Itagaki, et al., is a cross-sectional view of the conventional linear motor of FIG. 1A, viewed along the line II—II in FIG. 1A. In such a linear motor at the coil head area 12', the coil heads are stacked on top of each other. This arrangement requires a wide head area 12'.

Such a conventional linear motor has several disadvantages, one of the which is the difficulty of installation and removal. As shown in FIGS. 1A 1B, a magnetic track is formed by magnets 2 and the magnetic side rails 3. The magnetic track has a wide head area configured to match the shape and size of the wide head area 12' of coil assembly 12. To remove coil assembly 12 from the magnetic track, coil assembly 12 must slide away from the magnetic track in a direction perpendicular to the surface of the paper. Since the equipment (e.g. an X-Y stage) attached to coil assembly 12 is often heavy and difficult to handle, special tools are typically required during installation and removal of coil assembly 12.

Another disadvantage of a conventional linear motor coil is its low efficiency. FIG. 2 shows a cross sectional view of a linear motor coil taken at a cross section perpendicular to the wire direction. Since the wire is not close packed, air gaps 50 inevitably result, substantially lowering the conductor density of the coil. As discussed above, lower conductor density often corresponds to lower motor efficiency.

It is therefore desirable to provide a linear motor having a motor coil with improved efficiency, low heat dissipation, and easy installation.

SUMMARY

A motor in accordance with the invention overcomes the above and other drawbacks of conventional linear motors. According to the invention, a linear motor comprises a motor coil in cooperation with an associated magnetic track. The motor coil includes a linear assembly of coil units, each similar to the other. Each coil unit has an electrically conductive wire wound into a closed band in a predetermined number of layers, typically a single layer. The shape of the closed band is geometric polygonal, such as diamond shaped, hexagonal, or double diamond shaped, having inner edges surrounding a void. Some embodiments comprise a row of parallelogram shaped closed bands folded into a row of double diamond shaped coil units. In some embodiments, the width of the void is an integral multiple of the width of the closed band.

The coil units are made e.g. of flex circuit material or by winding electrically conductive wires in a racetrack or folded tip fashion. In some embodiments the width of a coil unit is equal to the magnetic pitch of the associated magnetic track. In other embodiments the width of a coil unit is equal respectively to one-half or two-thirds of the magnetic pitch.

The stage device of the present invention has a base, a mounting base which is movable relative to the base, and a driving device for driving the mounting base, and the driving device employs the above-mentioned linear motor or the above-mentioned electric motor as a part of a driving source.

The exposure apparatus of the present invention for forming a specified image on a substrate mounted on a substrate stage, has the above-mentioned linear motor or the above-mentioned electric motor as a part of a driving source for driving said substrate stage.

The exposure apparatus of the present invention for transferring a pattern, formed on a mask mounted on a mask stage, onto a substrate mounted on a substrate stage, has the above-mentioned linear motor or the above-mentioned electric motor as a part of a driving source for driving at least one of said mask stage and said substrate stage.

Advantageously this arrangement provides high electrical efficiency and ease of disassembly. The coil units are stacked together in a partially overlapped fashion to form a row of coil units in the motor coil so that the number of layers of wire in the useful area is substantially uniform across the entire coil. Unlike the wide end coil shape of Itagaki et al., the present shape is more planar (not flared out at the end) and so has a flat cross section that allows the coil to be easily removed from and installed in the magnetic track.

BRIEF DESCRIPTION OF THE DRAWINGS

FIG. 4C is a perspective view of a race track type coil unit, according to the invention;

FIGS. 5A and 5B are respectively a plan view and an end view of a race track type diamond shaped linear motor coil suitable for a fixed magnetic track motor, according to the invention;

FIG. 16C is a cross-section view of a linear motor coil core made of flex circuit, illustrating the structure and the electrical connection of the coil core;

FIG. 18 is a plan view of stacked parallelogram shaped wire bands prior to folding to form a row of race track double diamond shaped coil units, according to the invention;

DETAILED DESCRIPTION OF THE EMBODIMENTS

In accordance with the invention, a linear motor coil includes a linear assembly of coil units, each similar to the other. Each coil unit has an electrical conductor formed into a closed band in a designated number of layers, typically a single layer. The shape is that of a substantially planar geometric polygon, such as diamond shaped, hexagonal, parallelogram, or double diamond shaped. The coil units are formed from e.g. electrically conductive wires, ribbon, or flex circuit material.

Figure 1A:
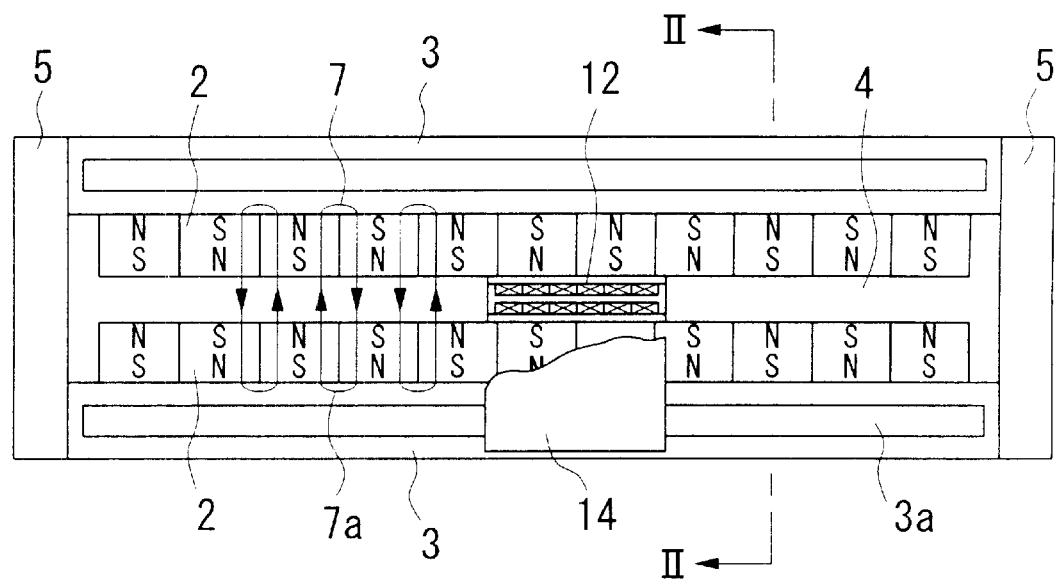
FIG. 1A is a plan view of a conventional linear motor.
Figure 1B:
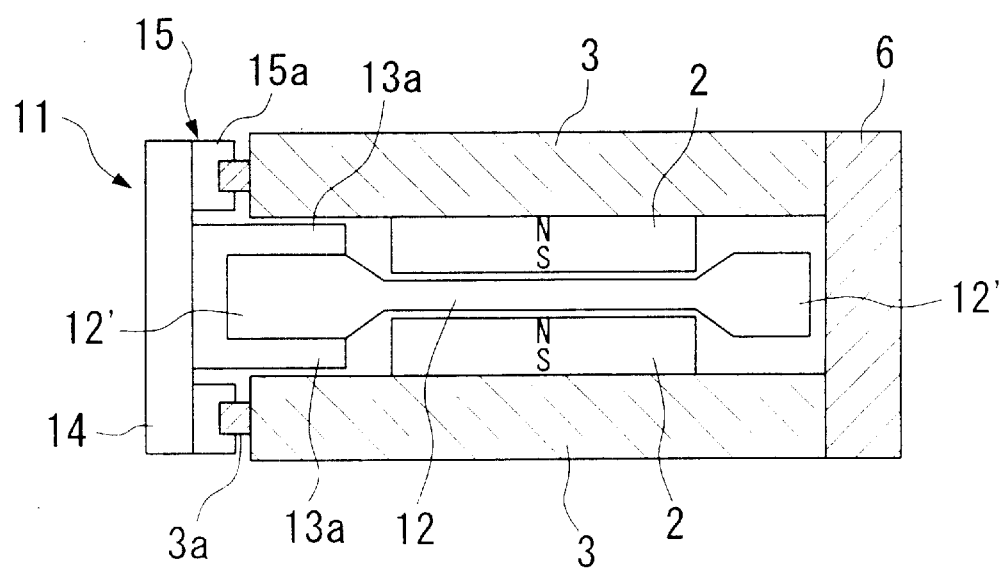
FIG. 1B is a cross-sectional view of the conventional linear motor of FIG. 1A, viewed along the line II—II.
Figure 2:
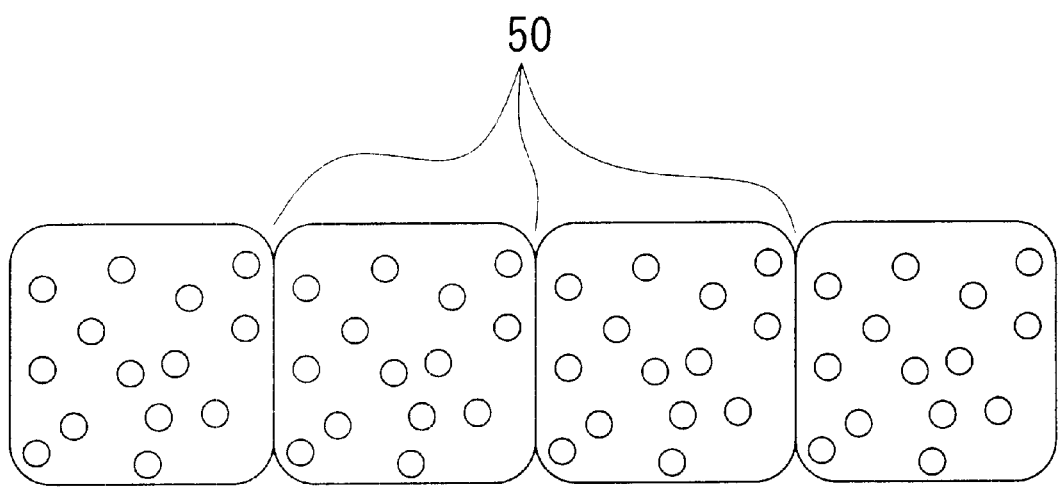
FIG. 2 is a cross-sectional view of a conventional motor coil units, showing inefficiently used cross-sectional area.
Figure 3A:
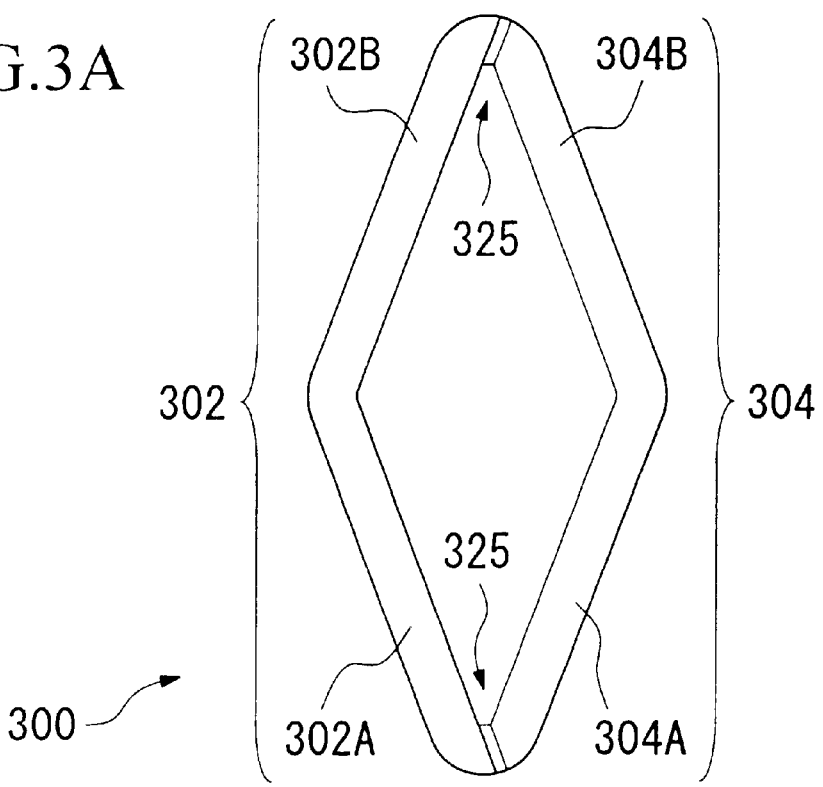
FIG. 3A is a plan view of a race track type diamond shaped coil unit, according to the invention.

FIG. 3A shows a diamond shaped motor coil unit 300, in accordance with the invention. A pair of adjacent legs 302A and 302B define section 302, and another pair of adjacent legs 304A and 304B define section 304. Between sections 302 and 304 are shoulders 325. Sections 302 and 304 and shoulders 325 are integrally formed with one electrically conductive wire or ribbon of substantially uniform cross-section. Shoulders 325 are created along the extension line of inner borders of legs 302A and 302B of coil unit 300. The inner borders of legs 302A, 302B, 304A, and 304B define a diamond shaped closed conductive band surrounding a diamond shaped void in the central portion.

Figure 3B:
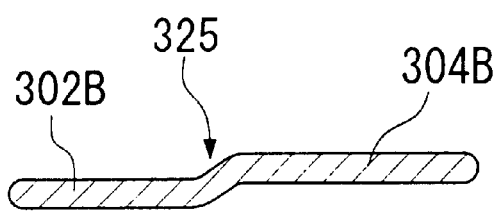
FIG. 3B is a cross-sectional view of the tip area of the race track coil unit of FIG. 3A, according to the invention.
Figure 3C:
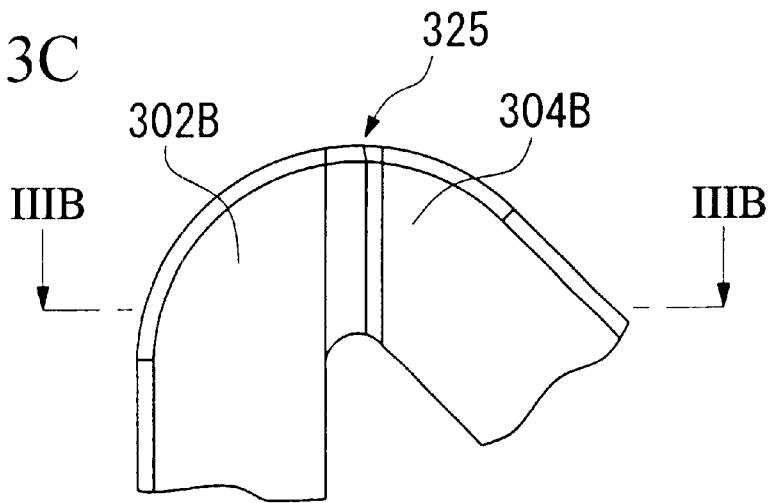
FIG. 3C is an enlarged side view of the tip area of the race track coil unit of FIG. 3A, according to the invention.

Sections 302 and 304 are arranged in a step-like relationship, whereby section 302 resides in a first plane and section 304 resides in a second plane parallel to and offset from the first plane. The distance between the first and the second planes varies depending on the cross-section of the wire and number of layers. When the coil unit has only one layer of wire, the distance between the first and the second planes is approximately equal to the thickness of the wire. A cross-sectional view of a tip area (where adjacent legs join) formed by the legs 302B and 304B of a "race track" type coil unit (the wire is turned from the outside to the inside, or from the inside to the outside, forming a concentric shape) is shown in FIGS. 3B and 3C. Such a coil unit comprises a single layer of wire or ribbon wound continuously to form a wire band.

Figure 4A:
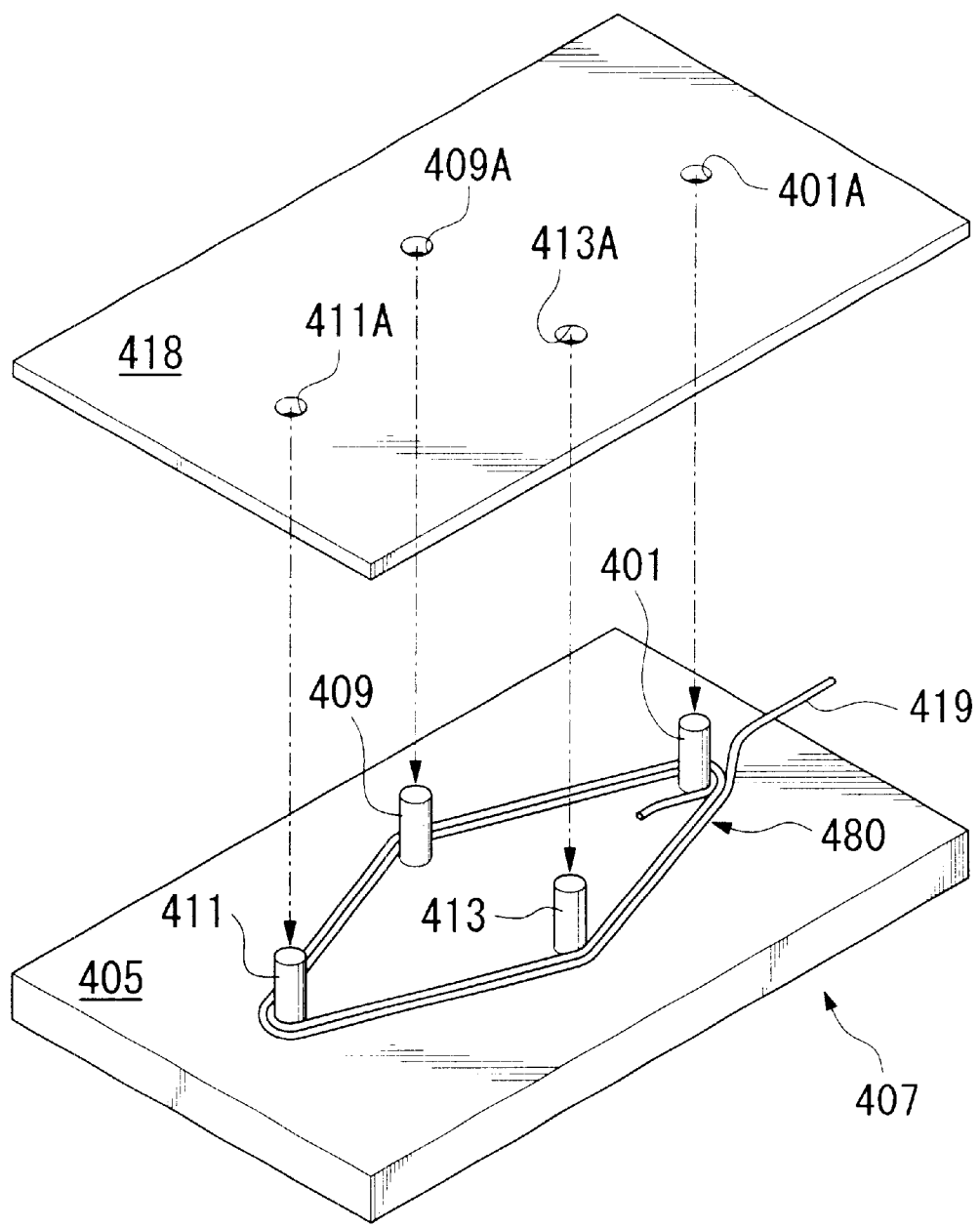
FIG. 4A is a perspective view of an apparatus for winding a race track type wire band, according to the invention.

One step in manufacturing a race track type coil unit is to wind a suitable electrically conductive wire or ribbon with surface insulation into a wire band. FIG. 4A shows an apparatus 407 suitable for winding the wire band. Apparatus 407 has a flat platform 405 with four pegs 401, 409, 411, and 413 installed at four positions forming the corners of a diamond shape. To form a wire band 480, electrically conductive wire 419 is wound around pegs 401, 409, 411, and 413, and back to peg 401. The above process repeats until a desired width is reached. During the winding process, wire 419 is pressed closely against platform 405 to ensure that the wire is tightly wound. Wires are carefully laid next to each other in a planar configuration.

In some embodiments, as shown in FIG. 4A, an optional guide plate 418 is used to assist the winding of wire band 480. Guide plate 418 has four holes 401A, 409A, 411A, and 413A in alignment with pegs 401, 409, 411 and 413 on platform 405. When guide plate 418 is used, each of the pegs 401, 409, 411 and 413 fits into its corresponding hole. Guide plate 418 is spaced above parallel to platform 405 at a distance substantially equal to the thickness of the wire. A flat gap is thus formed between platform 405 and guide plate 418. During wire winding, tension is applied to the wire to ensure that wire band 480 is tight. The use of guide plate 418 prevents the wire from slipping.

Figure 4B:
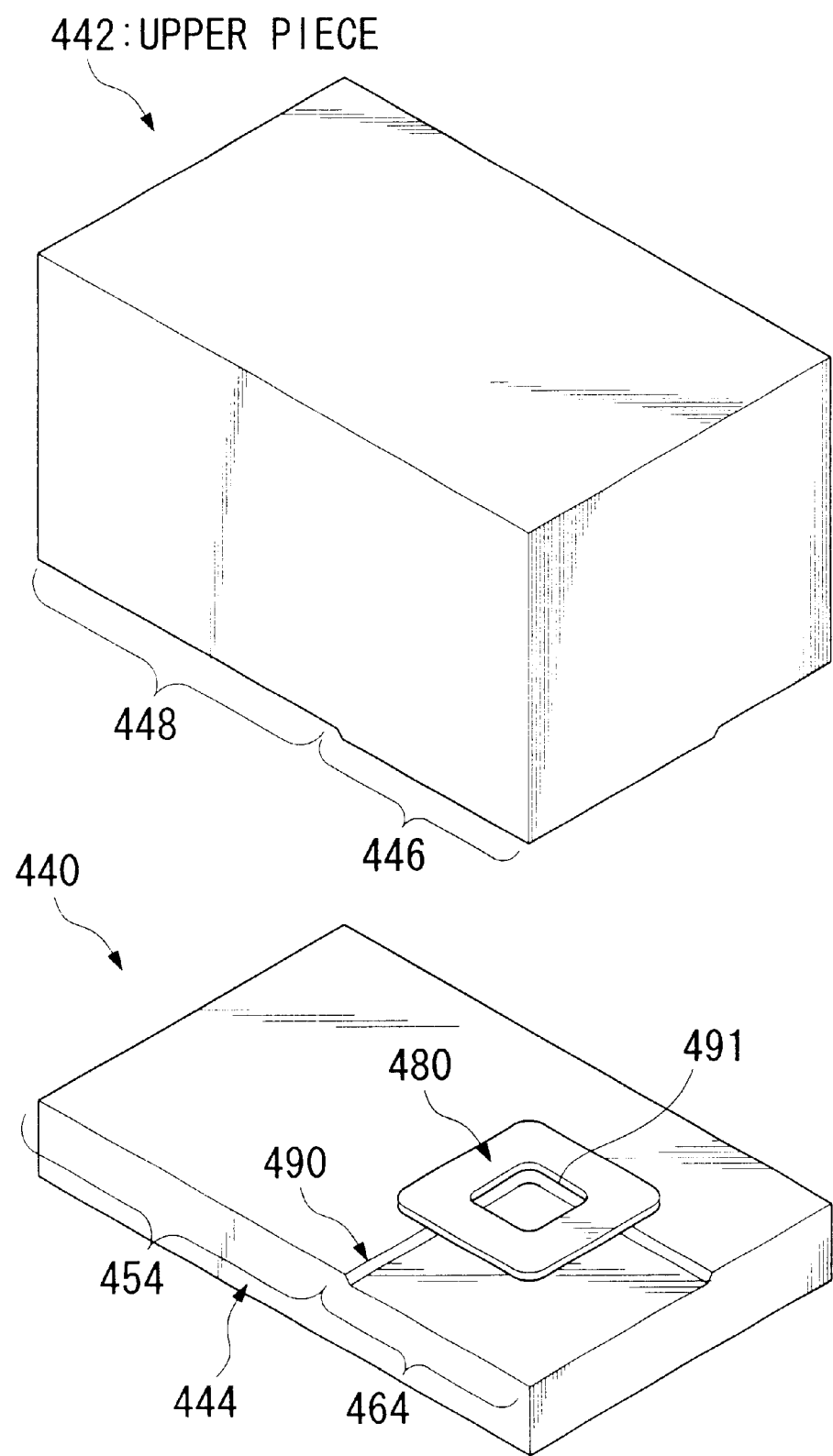
FIG. 4B is a perspective view of a section of an apparatus for pressing a wire band into the final shape of a coil unit, according to the invention.

Another step in the manufacturing of a coil unit is to press flat wire band 480 into a final shape of a coil unit. This step is performed on an arbor press with a special tool. One example of a special tool 440 is shown in FIG. 4B. Special tool 440 has upper piece 442 and lower piece 444. The working surfaces of both the upper and lower pieces are profiled so that a coil unit with a desired step-like shape is produced. For example, upper piece 442 has section 446 on one side and section 448 on the other side. Both sections 446 and 448 have a flat working surface, with the working surface of section 446 protruding beyond the working surface of section 448. Lower piece 444 has section 454 in correspondence with section 448, and section 464 in correspondence with section 446. The working surface of section 454 protrudes beyond the working surface of section 464. The working surfaces of sections 454 and 464 are separated by a chevron shaped shoulder 490. Sections 448 and 446 are also separated by a shoulder with a corresponding chevron shape (not shown). At a closed position a step-like air gap is formed between upper piece 442 and lower piece 444.

During the pressing operation, wire band 480 is placed on the working surface of lower piece 444. Wire band 480 is so positioned that the inner borders of two adjoining legs are placed on section 454 of the lower piece 444 of tool 440 parallel and adjacent shoulder 490. Upper and lower pieces 442, 444 of tool 440 then close to grip wire band 480. Wire band 480 is thus forced to assume the shape of the air gap defined by the upper and lower pieces of tool 440. The product of the pressing operation is a step-like coil unit 496 as shown in FIG. 4C.

Referring to FIG. 3A, coil unit 300 is of an electrically conductive wire or ribbon coated with an electrically insulating layer, e. g. insulated copper wire. Wires of other electrically conductive material, such as aluminum, silver and gold, are also suitable. Suitable copper wire is available from MWS, Los Angeles, Calif. In one example, the wire used is American Wire Gage (AWG) 19 heavy build copper wire (of approximately 1.0 mm diameter.) In another example, the wire used is AWG 16 heavy build copper wire (of approximately 1.3 mm diameter.) The finished coil is assembled in a "can" (housing) of e. g. magnetically impermeable 300 series stainless steel, preferably 304 stainless steel. In some embodiments other magnetically impermeable materials such as aluminum, or ceramic are used for the can. Similar materials are used for making coils of other configurations described in this specification.

FIGS. 5A and 5B are plan and cross-sectional views, respectively, of one row of motor coil units 501. In FIG. 5A, all coil units 502–507 are arranged in a staggered overlapping relationship, wherein each coil unit is partially on top of another coil unit. For example, coil unit 503 is stacked partially on top of coil unit 502, and coil unit 504 is stacked partially on top of coil unit 503. With this arrangement, for each row of coil units the working area, other than a small portion around the perimeter of the working aria, has a thickness of two layers of coil units. Because of the substantial uniformity in thickness, a linear motor coil manufactured according to the embodiment has a flat head area and is easy to install and remove in the track. A final motor coil normally uses several rows of coil units such as the one shown in FIGS. 5A and 5B stacked with their respective working areas directly on top of each other.

A linear motor in some embodiments has a moving coil configuration; in other embodiments a linear motor has a moving magnet configuration. In a moving magnet configuration, the motor coil is fastened to a part of a device, such as a base of a stepper (x-y) stage, and the magnetic track (fastened to the stage) moves relative to the coil. The coil is made relatively long, about the range of travel of the motor plus the length of the magnetic track. On the other hand, the magnetic track is made relatively short, only long enough to hold magnets for generating sufficient Lorentz force to propel the moving part of the motor.

In a moving coil configuration, the magnetic track is fastened to the base of the movable device and the coil (fastened to the stage) moves relative to the magnetic track. The magnetic track is made to be relatively long, about the range of travel of the linear motor plus the length of the coil. On the other hand, the coil is made relatively short.

The row of motor coil units 501 shown in FIGS. 5A and 5B is suitable for a moving coil motor. By adding more coil units to lengthen the row of coil units 501, the row of coil units 501 is made suitable for use as a movable magnet motor. Illustratively, the relevant dimensions of a row of coil units 501 shown in FIGS. 5A and 5B, are listed in Table 1:

TABLE 1

Relevant dimensions of a row of coif units, as shown in FIGS. 5A and 5B.

| Dimension | Length (mm) |
| --- | --- |
| D51 | 1 |
| D52 | 2 |
| D53 | 104 |
| D54 | 6.95 |
| D55 | 50 |
| D56 | 33.32 |
| D57 | 24.99 |
| D58 | 16.66 |
| D59 | 8.33 |
| D510 | 8.33 |

Figure 6A:
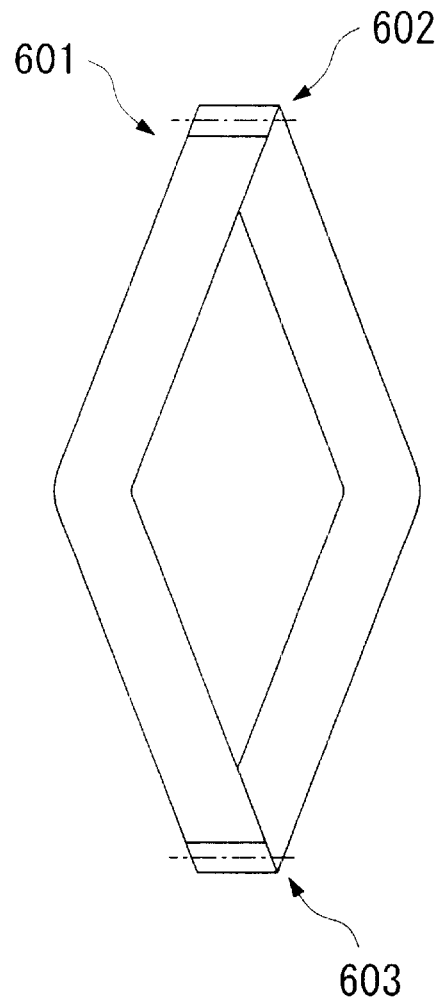
FIGS. 6A and 6B are respectively a plan view and an end view of a diamond shaped folded tip coil unit, according to the invention.
Figure 6B:
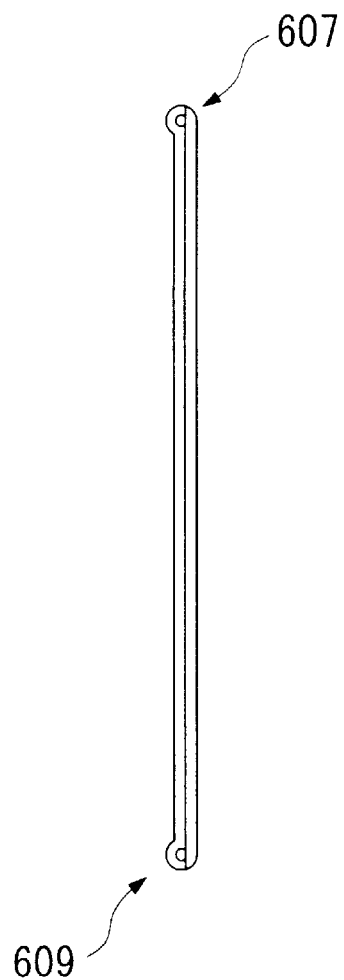

Another example of a motor coil according to the invention is shown in FIGS. 6A (plan view) and 6B (cross-sectional view). Coil unit 601 in FIGS. 6A and 6B is called a folded tip coil unit because of its two folded tips 602 and 603. Each of folded tips 602 and 603 has a fold radius such as fold radii 607 and 609. Fold radii 607 and 609 are often desirable for protecting the surface insulation of the coil wire and for preventing the wire from breaking.

Figure 7A:
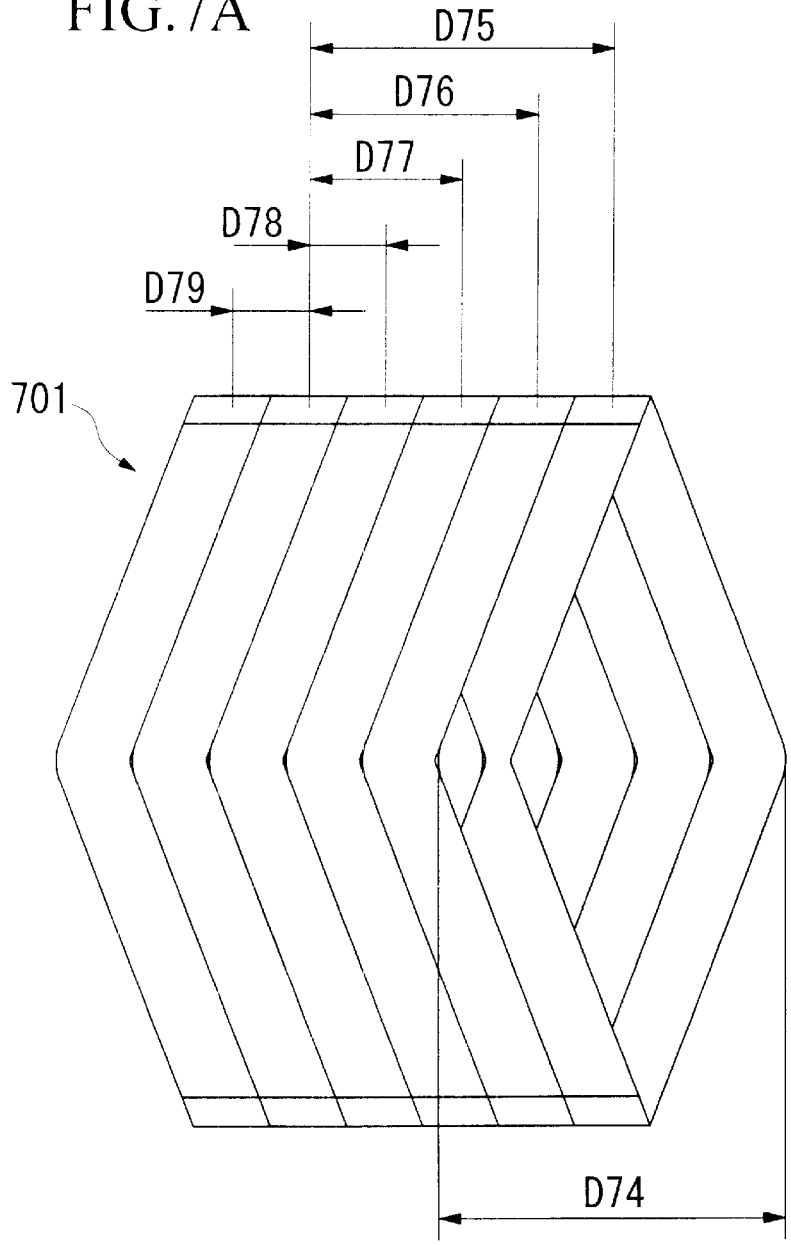
FIGS. 7A and 7B are respectively a plan view and an end view of a motor coil suitable for a fixed magnetic track motor using diamond shaped folded tip coil units, according to the invention.

FIGS. 7A (plan view) and 7B (side view) show several folded tip coil units assembled together to form a row of motor coil units 701. Similar to row of motor coil units 501 shown in FIG. 5A, row of motor coil units 701 has two layers of wire across the majority of its working area, while along a small portion at the ends of row 701 there is one layer of wire. Illustratively, shown in FIGS. 7A and 7B are the relevant dimensions listed in Table 2 for a row of folded tip diamond shaped linear motor coil units 701.

TABLE 2

Figure 7B:
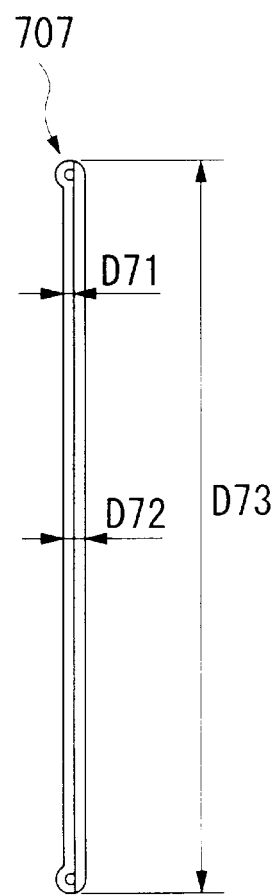

Relevant dimensions for a row of folded tip diamond shaped linear motor coil units, as shown in FIGS. 7A and 7B.

| Dimension | Length (mm) |
| --- | --- |
| D71 | 1 |
| D72 | 2 |
| D73 | 104 |
| D74 | 50 |
| D75 | 33.32 |
| D76 | 24.99 |
| D77 | 16.66 |
| D78 | 8.33 |
| D79 | 8.33 |

Figure 8A:
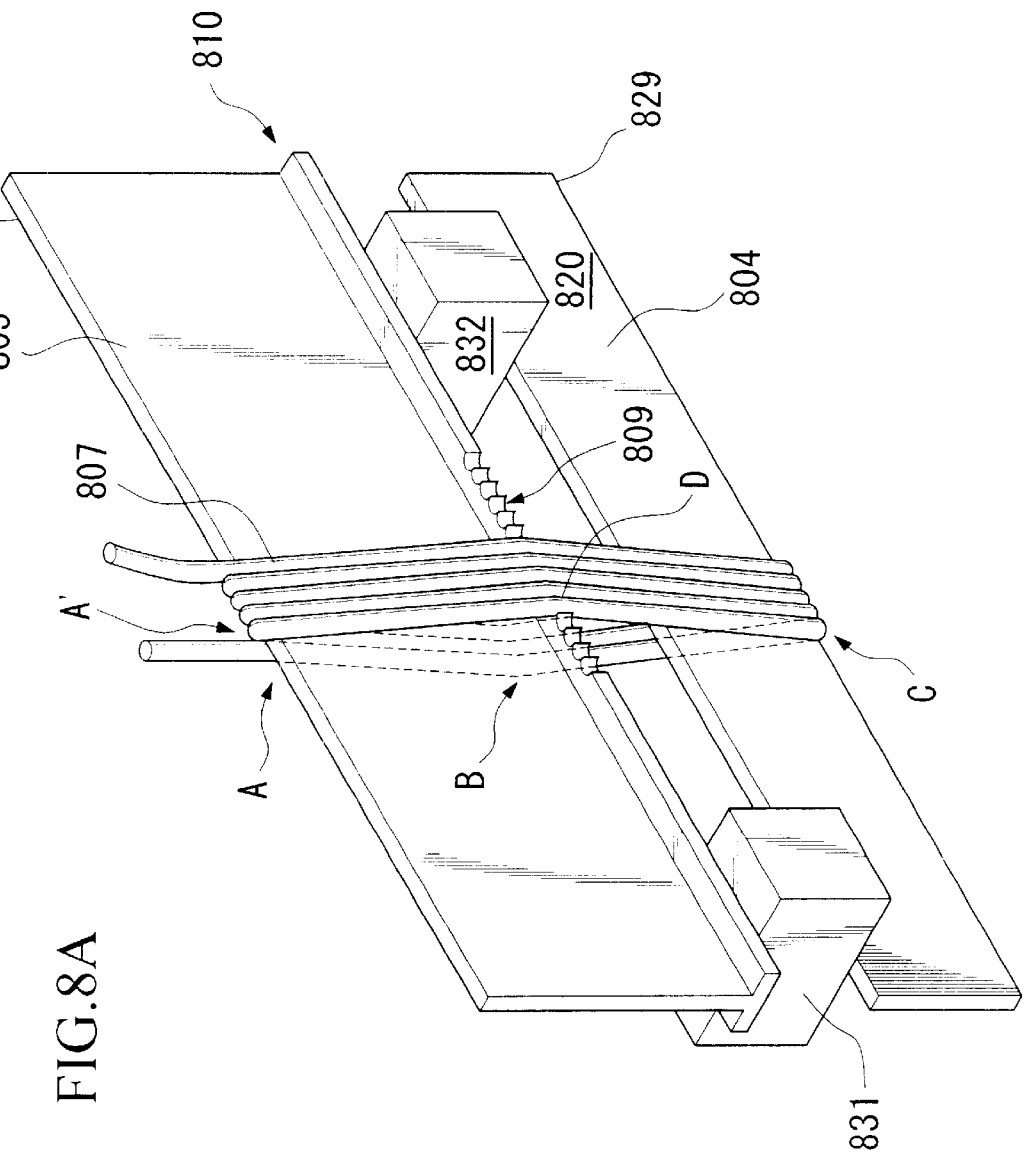
FIG. 8A is a perspective view of an apparatus for winding a diamond shaped folded tip wire band, according to the invention.

One step in making such a folded tip diamond shaped coil unit is to wind an electrically conductive wire in to a wire band. An apparatus for winding a folded tip diamond shaped wire band is shown in FIG. 8A. The apparatus includes a first thin plate 805 and a second thin plate 804 held apart by removable braces 831 and 832. The width of the apparatus is defined by edge 819 of thin plate 805 and edge 829 of thin plate 804. A blade 810 extends symmetrically perpendicular to the plane of thin plate 805. Blade 810 of thin plate 805 coincides with the center line of the apparatus as shown in FIG. 8A and contains a row of guide teeth 809 on each edge. Guide teeth 809 are arranged in a comb-like fashion and are perpendicular to the plane of thin plate 805.

To wind a diamond shaped folded tip wire band, wire 807 is wound around points A, B, C, and D, where it is held in fixed positions at points B and D by two pairs of guide teeth. Wire 807 is then wound to position A', where the winding process is repeated until the wire band has reached a sufficient width. Removable braces 831 and 832 are then removed to allow thin plates 805 and 804 to be separated from the wire band.

Figure 8B:
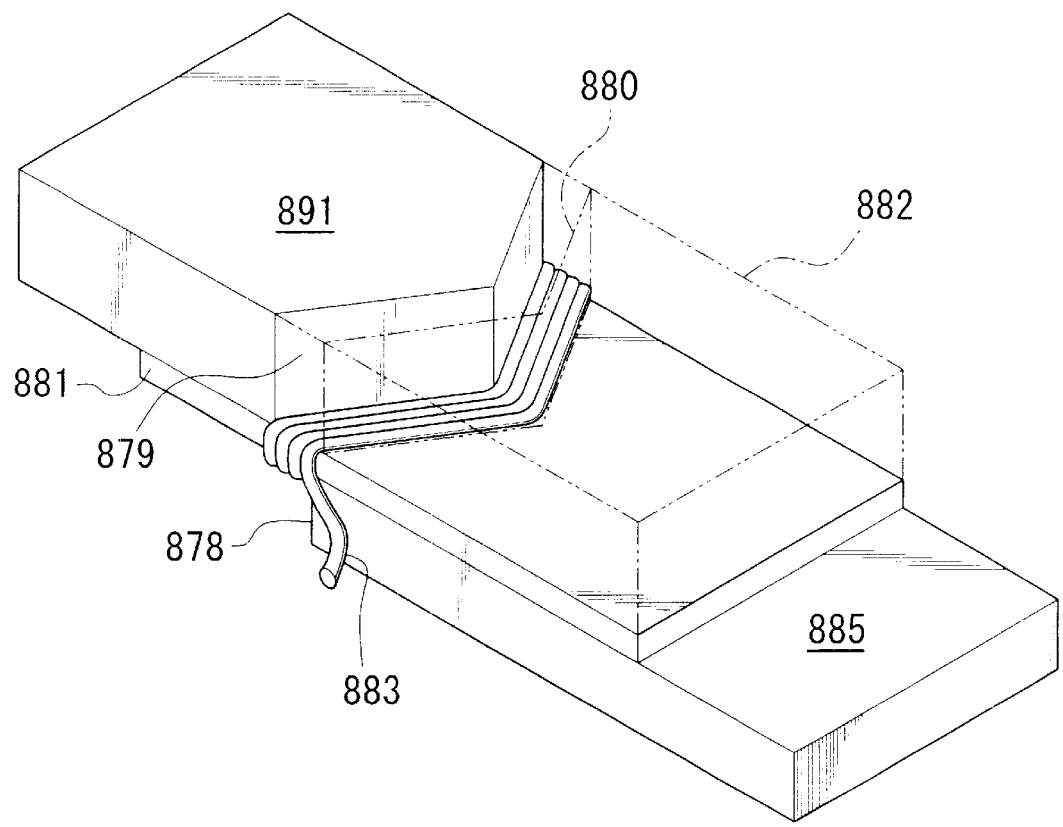
FIG. 8B is a perspective view of an alternative apparatus for winding a diamond shaped folded tip wire band, according to the invention.

FIG. 8B shows another apparatus for winding a wire band. The apparatus includes a thin plate 881 and three chevron shaped pieces 891, 882 (shown cutaway), and 885. The process for winding a wire band using this apparatus starts with placing thin plate 881 between chevron shaped pieces 891, 882, and 885. Wire 883 is started at the near end of a chevron surface 878 of chevron shaped piece 885 and is wound along the intersection between chevron surface 878 and thin plate 881. At the far end of surface 878, wire 883 passes around thin plate 881 to follow a chevron surface 880 of chevron shaped piece 882, where it is held in place by a "pacer (not shown) wedged between wire 883 and a chevron surface 879 of chevron shaped piece 891. Wire 883 is wound around again similarly. Each time wire 883 is wound, the spacer is replaced by a slightly thinner spacer, until the gap between chevron surfaces 879 and 880 is filled with wire. Chevron shaped piece 882 is needed, because wire 883 winds from the outer border in toward the inner border in one section of the wire band. In other embodiments, variations of this tool are applied, without departing from the inventive principle described herein.

Figure 8C:
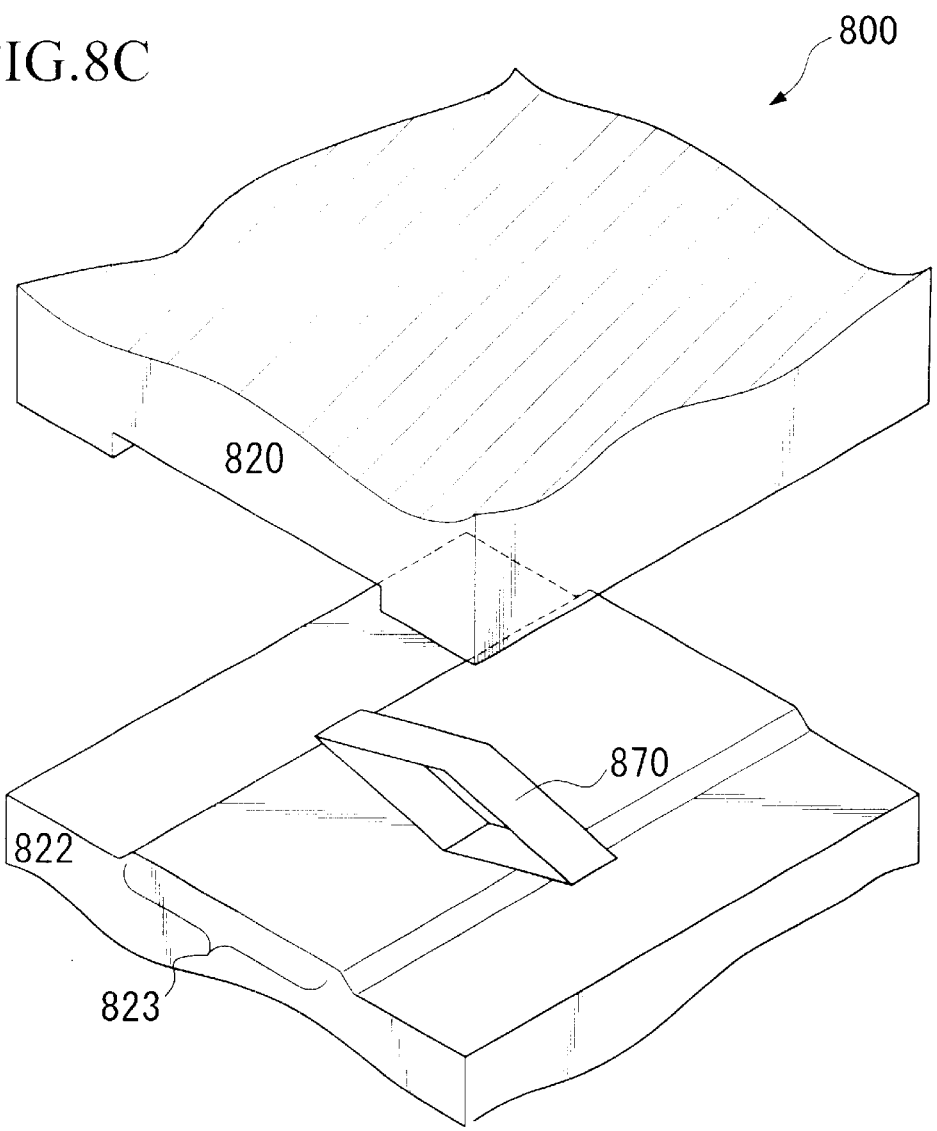
FIG. 8C is a perspective view and FIG. 8D is a side view of an apparatus for pressing a folded tip wire band into the final shape of a motor coil unit, according to the invention.
Figure 8D:
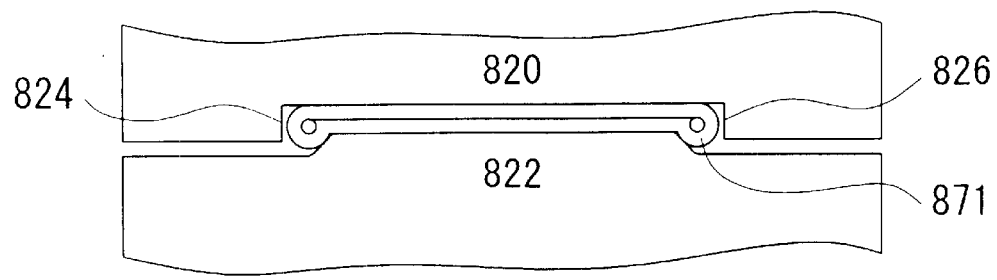

Another step in making a folded tip diamond shaped coil unit is to press the wire band into the final shape of a coil unit. This is performed on an arbor press using a press tool. FIGS. 8C and 8D show one example of such a press tool 800 having upper piece 820 and lower piece 822. Upper piece 820 has a flat working surface between edges 824, 826 while lower piece 822 has elevated rectangular section 823. Elevated rectangular section 823 also has a flat working surface. Wire band 870 is carefully positioned on top of the lower piece such that the body of wire band 870 rests on convex section 823 while the tips extend beyond convex section 823. Upper piece 820 is then lowered pressing wire band 870. Edges 824, 826 control the coil unit width when it is pressed. The final shape of the coil unit 871 is shown in FIG. 8D.

Alternatively, the row of coil units is first stacked, then pressed together.

Figure 9A:
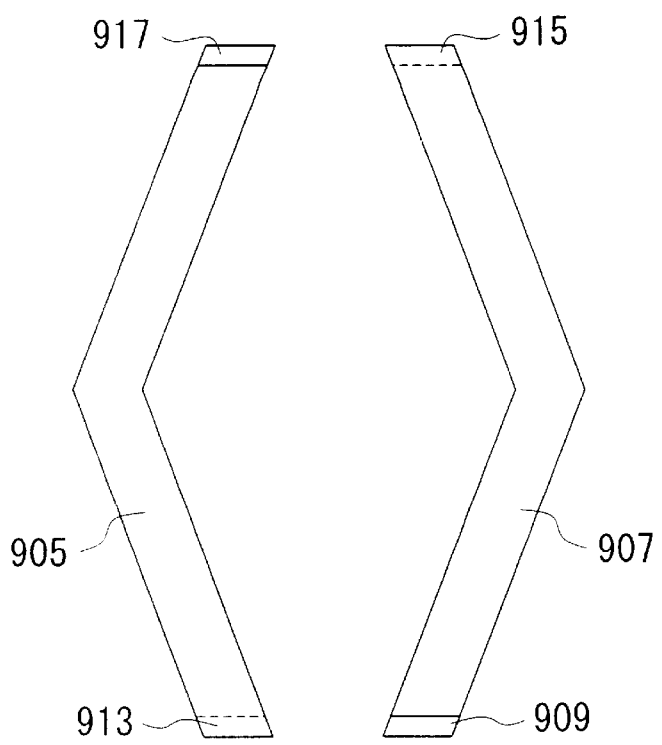
FIG. 9A is an exploded plan view of a diamond shaped coil unit using a flex circuit, according to the invention.

In some embodiments flex circuit coil units, such as flexible substrates, are used in the motor coil. Illustratively, a flex circuit coil unit is shown in FIG. 9A. Flex circuit conventionally is a sheet of electrically conductive material bonded with a layer of electrically insulating material 965 (see FIG. 9B) such as polyimide film. FIG. 9A schematically shows two coil legs 905 and 907 etched on flex circuit. In an installed position, stripped end 913 (back side) of leg 905 is electrically connected with stripped end 909 (front side) of leg 907. Connection is made by soldering or other suitable methods. Stripped end 917 (front side) of leg 905 and stripped end 915 (back side) of leg 907 are fitted to be connected to power supply wires or to another coil unit.

Figure 9B:
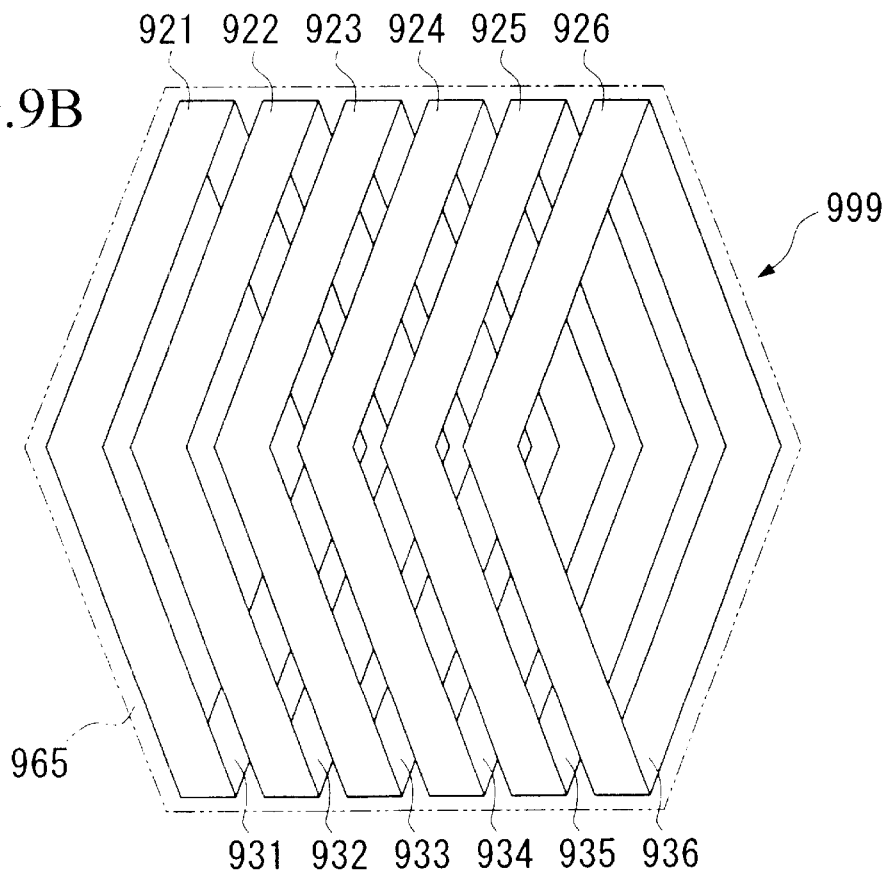
FIG. 9B is a plan view of a linear motor coil using flex circuit diamond shaped coil units, according to the invention.

FIG. 9B shows a section of a motor coil 999 using flex circuit in accordance with the invention. Coil legs 921, 922, 923, 924, 925, and 926 are etched on one sheet of flex circuit material, while legs 931, 932, 933, 934, 935, and 936 are etched on another sheet of flex circuit. The techniques for etching a flex circuit are well known to those skilled in the motor art.

Figure 9C:
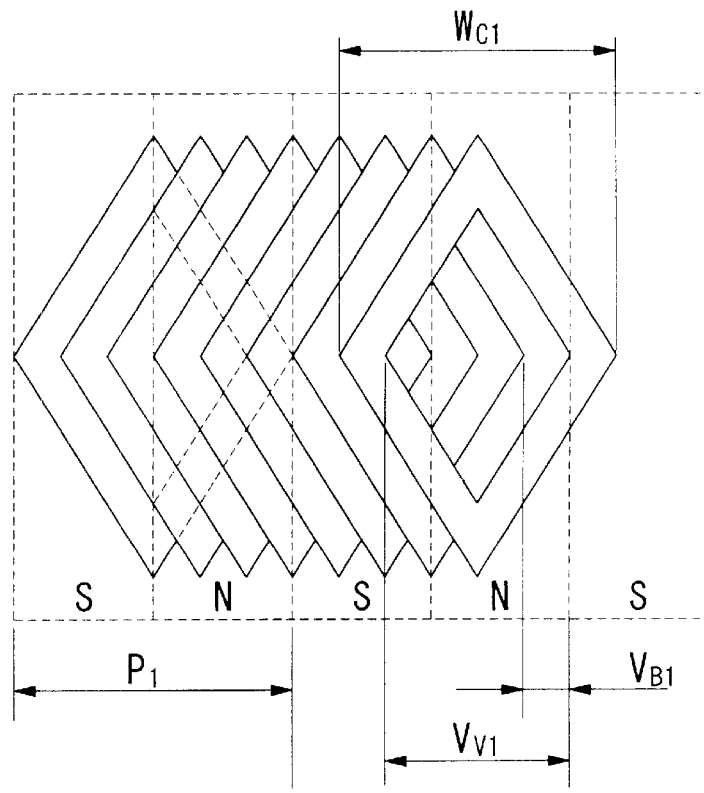
FIGS. 9C, 9D, and 9E are schematic plan views of linear motor sections using diamond shaped coil units, showing the coil unit width relative to the magnetic pitch, according to the invention.
Figure 9D:
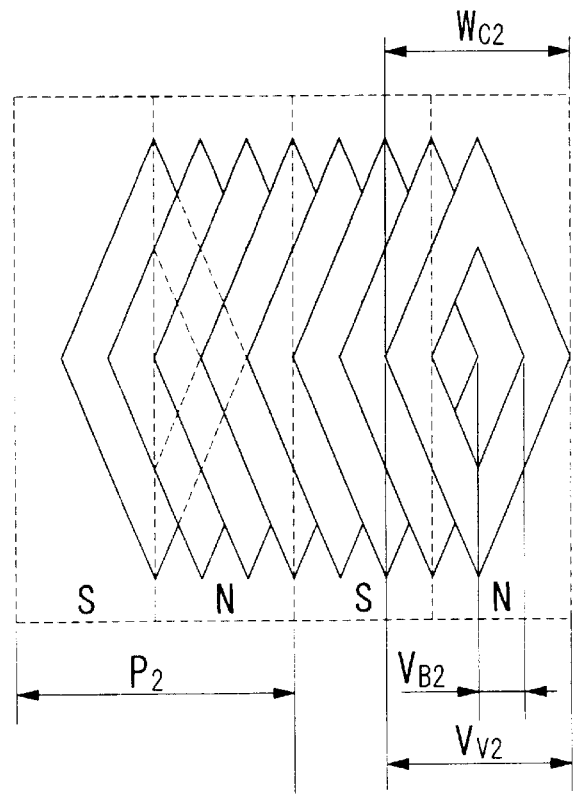
Figure 9E:
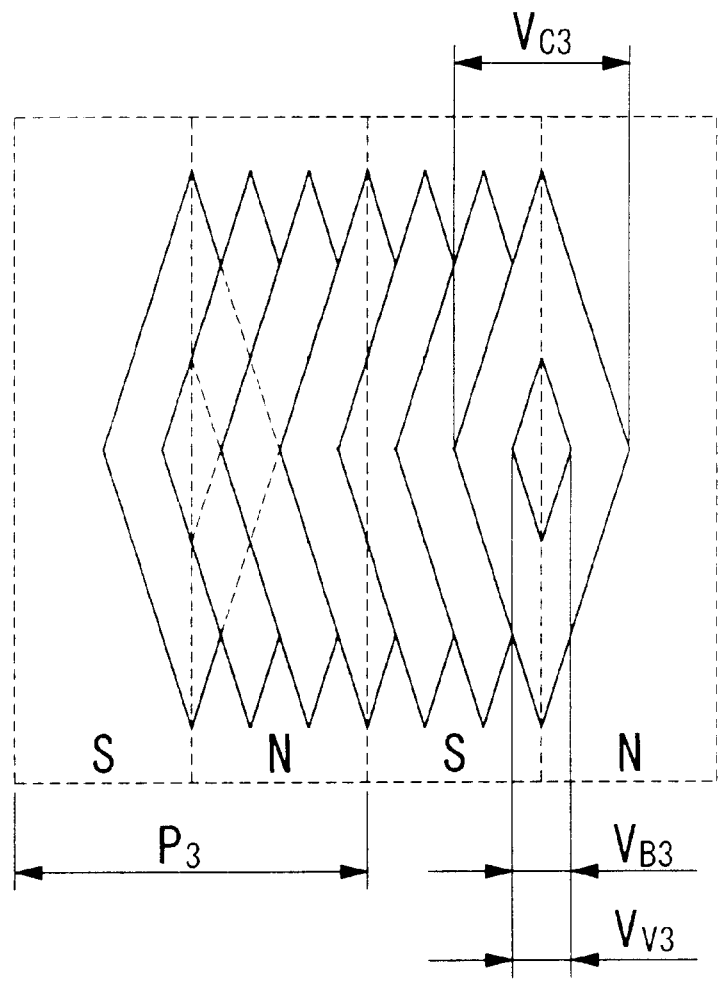

FIGS. 9C, 9D, and 9E depict linear motors using diamond shaped coil units. The coil unit width and wire band width relative to the magnetic pitch are as shown. These examples pertain to all diamond shaped coil units, including the race track hype, folded tip type, and the flex circuit type. Each of the examples shown has a different wire band width relative to the pole pitch. The motors shown in FIGS. 9C, 9D, and 9E all use three-phase commutation (three-phase alternating current). According to the invention, a linear motor is conventionally commutated using two or more phases of electric current to generate long range continuous motion. Single phase commutation is also possible, if short range linear motion is preferred.

In FIG. 9C, the width Wc1 of a coil unit is equal to the magnetic pitch P1. The width Vv1 of the diamond shaped void is equal to four times the width of the wire band $V_B1$. In the example shown in FIG. 9D, the width Wc2 of the coil unit is equal to ⅔ the magnetic pitch P2. The width Vv2 of the diamond shaped void is equal to twice the width $V_B2$ of the wire band. In the example shown in FIG. 9E, the width Vc3 of the coil unit is equal to one half of the magnetic pitch P3, and the width of the diamond shaped void Vv3 is equal to the width $V_B3$ of the wire band. Other configurations are possible according to the invention. In an alternative configuration not shown, it is desirable that the width of the diamond shaped void is an integral multiple of the width of the wire band.

In some embodiments a linear motor employs a hexagonal coil unit. FIG. 10A shows one example of a hexagonal coil unit. A hexagonal coil unit has two straight parallel legs 1011 and 1013 that are perpendicular to the movement direction of the coil. At the ends of the coils there are two triangular sections 1015 and 1017, each with two slant legs integrally formed with straight legs 1011 and 1013. The straight legs 1011 and 1013 and the triangular sections define a hexagonal shaped void in the central portion. Because straight legs 1011 and 1013 of the hexagonal coil unit are perpendicular to the movement direction of the coil, a greater Lorentz force is created for a given electric current in comparison with the diamond shaped coil units.

Because the resistance is approximately the same, the motor constant is higher. Theoretically, the Lorentz force generated by a hexagonal coil unit is in the range of approximately 30% greater than that generated by a diamond shaped coil unit.

Figure 10B:
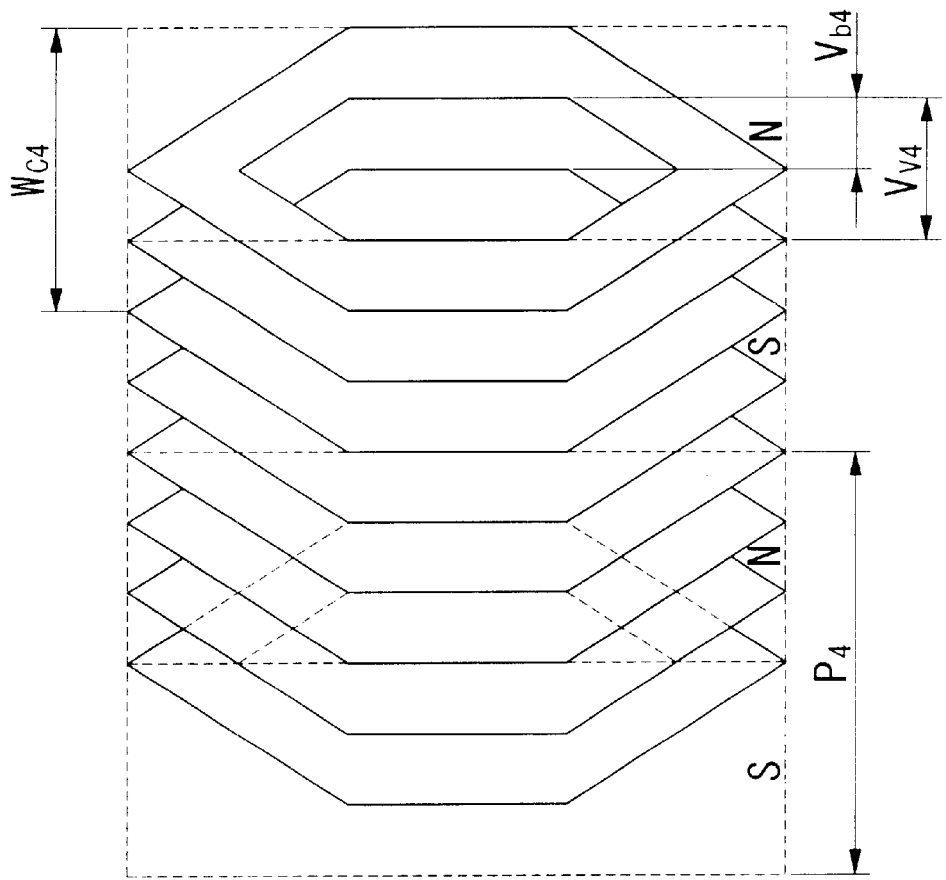
FIGS. 10B and 10C are schematic plan views of a linear motor section using hexagonal coil units, showing the coil unit width relative to the magnetic pitch, according to the invention.
Figure 10A:
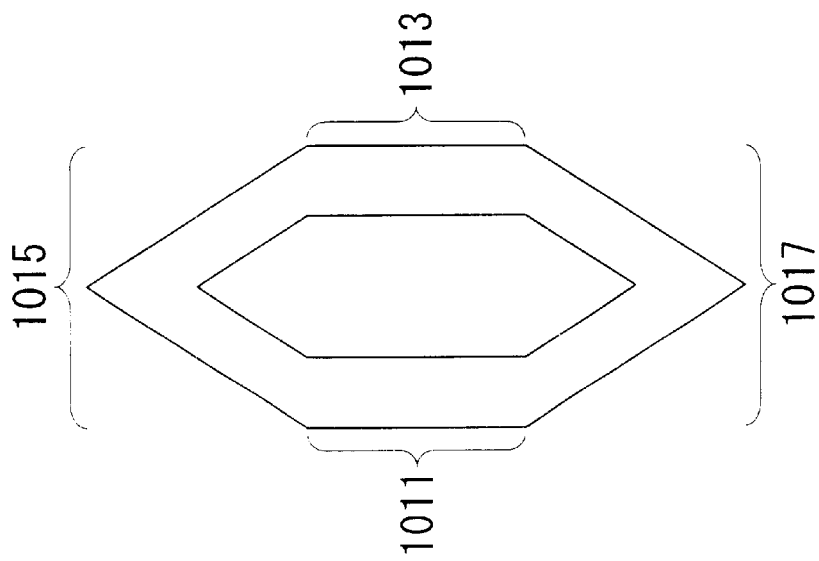
FIG. 10A is a plan view of a hexagonal coil unit, according to the invention.

FIG. 10B is a schematic view of a linear motor having one row of hexagonal coil units. In some embodiments a final motor coil assembly contains one row of coil units; in other embodiments a final motor coil assembly contains a plurality of rows of coil units. When more than one row of coil units is used, the rows of coil units are stacked on top of each other. One possible position of the magnets of the motor are shown in dashed lines. With a single layer coil unit, the row of coil units shown in FIG. 10B has two wire thicknesses across most of the working area. Only a small portion at the ends has one layer of wire.

Figure 10C:
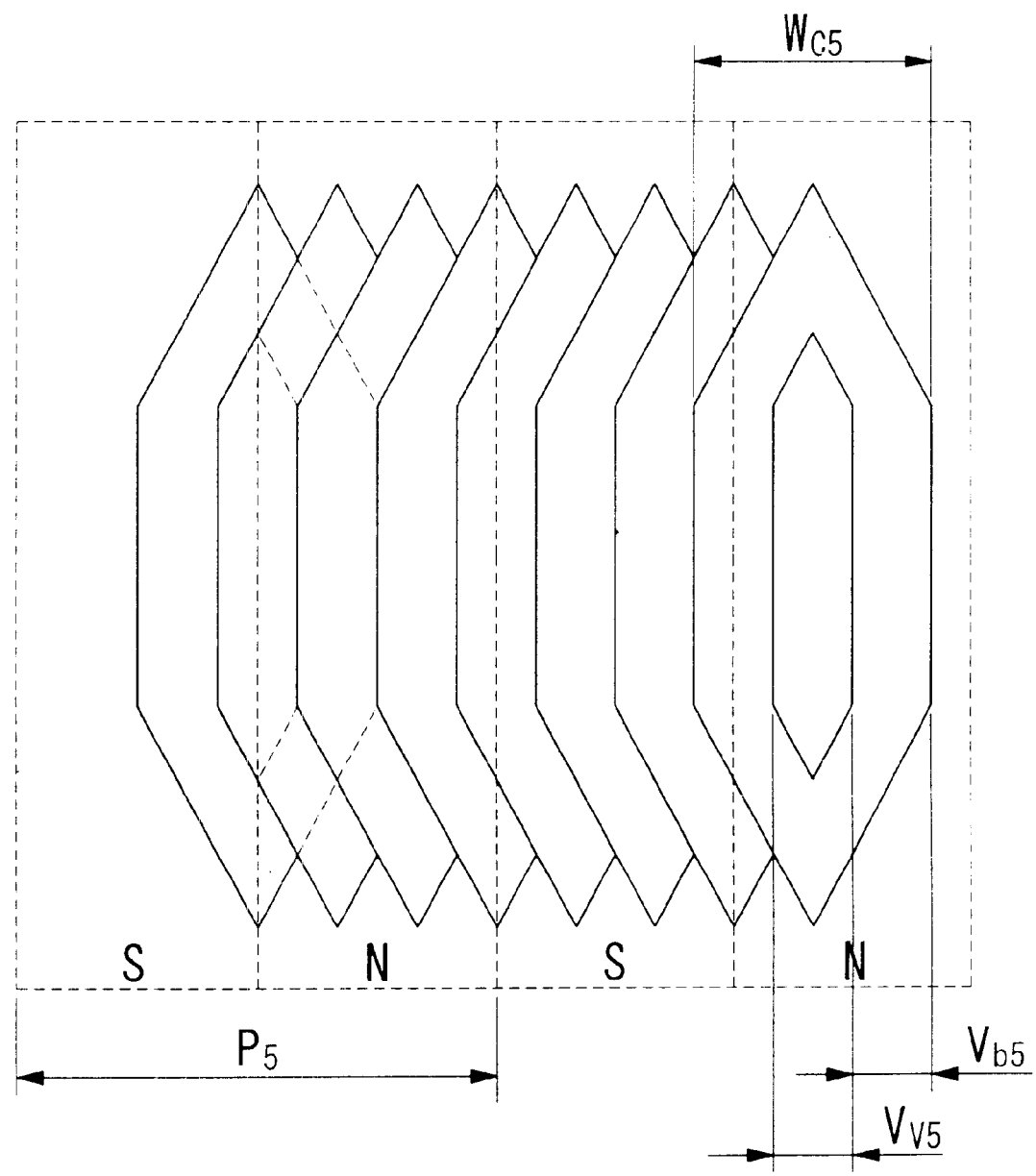

In the example shown in FIG. 10B, the width Wc4 of the coil unit is equal to ⅔ of the magnetic pitch P4. The hexagonally shaped void has a width Vv4 of twice the width Vb4 of the wire band. In another example of a linear motor shown schematically in FIG. 10C, the width Wc5 of the coil unit is equal to one half of the magnetic pitch P5. The width of the hexagonal shaped void Vv5 is equal to the width Vb5 of the wire band. Other alternative configuration are possible according to the invention. In each of these configurations, it is desirable for the width of the hexagonal shaped void to equal an integral multiple of the width of the wire band.

Both race track type and folded tip type hexagonal coil units are manufactured according to the invention. One step in making a race track hexagonal coil unit is to wind a flat wire band.

This is performed using an apparatus similar to that shown in FIG. 4A. Since a coil unit in this example has a hexagonal shape, the apparatus shown in FIG. 4A must be modified to have 6 pegs instead of 4 pegs. Another step in making a race track hexagonal coil unit is to press the wire band into the final shape using a press tool similar to that shown in FIG. 4B.

Figure 11A:
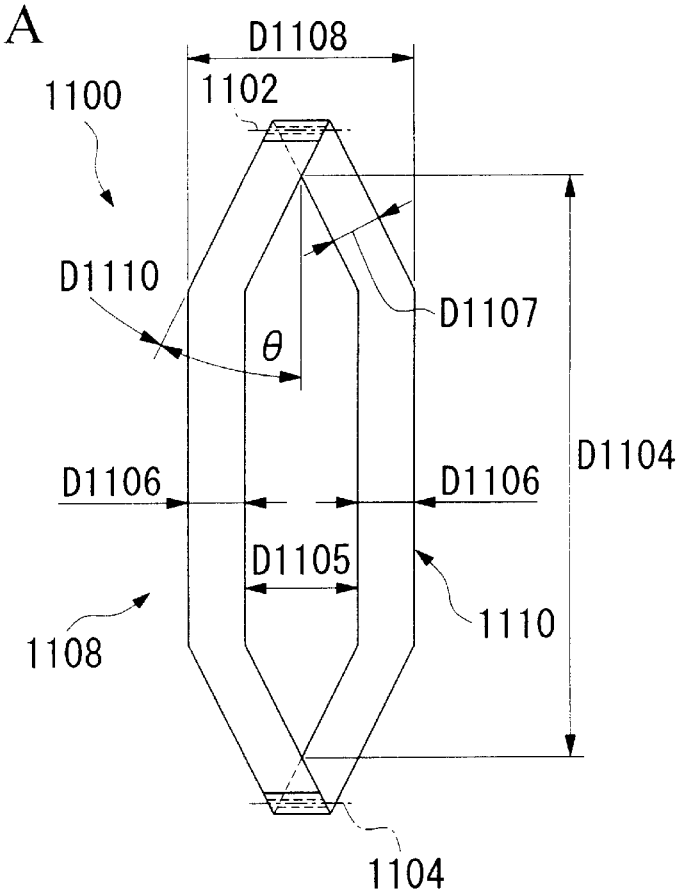
FIGS. 11A, 11B, and 11C are respectively a plan view, a cross-sectional view, and a perspective view of a folded tip hexagonal coil unit, according to the invention.
Figure 11B:
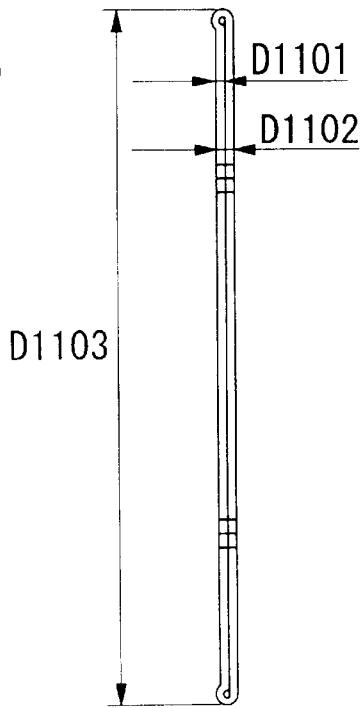
Figure 11C:
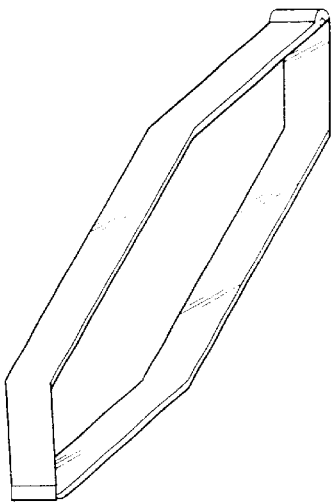

A variation of the coil unit shown in FIG. 10A is the folded tip hexagonal coil unit 1100 as shown 5 in FIGS. 11A (plan view), 11B (side view), and 11C (perspective view). Coil unit 1100 is called a folded tip hexagonal coil unit because of the folded tips 1102 and 1104. Coil units 1100 has two sections 1108 and 1110. Section 1108 is in a first plane, while section 1110 is in a second plane parallel and offset from the first plane. The first and second planes are set apart by a predetermined distance. The distance between the first plane and the second plane varies to maximize conductor density, and is typically one wire thickness for a single layer coil unit.

Figure 12:
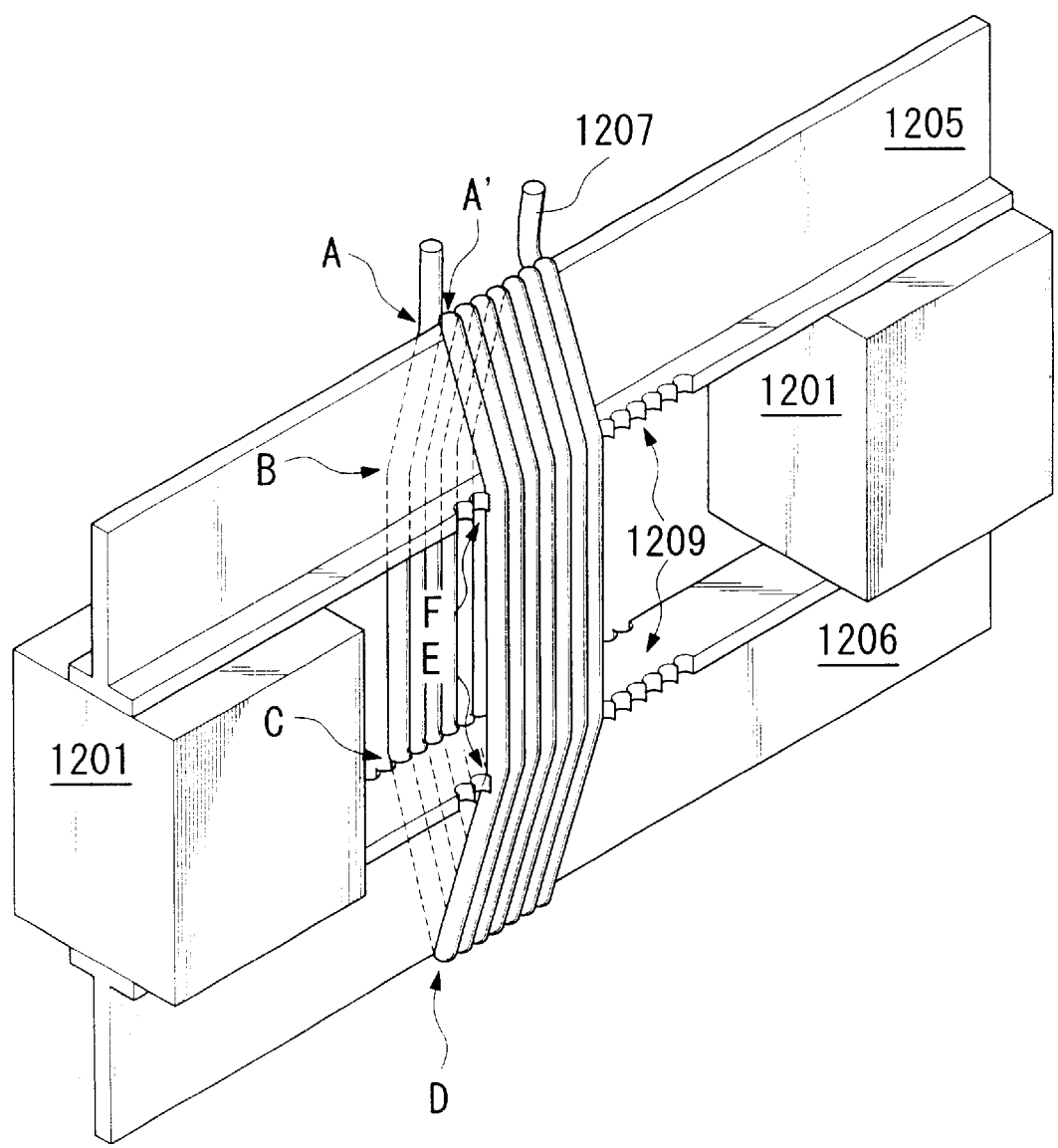
FIG. 12 is a perspective view of an apparatus for winding a folded tip hexagonal wire band, according to the invention.

One step in making folded tip coil unit 1100 is to wind wire to form a hexagonal wire band. An apparatus for winding a wire to form a wire band is shown in FIG. 12. This apparatus is similar to that shown in FIG. 8A, but with two rows of guide teeth 1209 on each of plates 1205 and 1206. Plates 1205 and 1206 are separated by removable braces 1201. To form a wire band using the apparatus shown in FIG. 12, wire 1207 is first wound around points A, B, C, D, E, and F. At each of points B, C, E, and F, wire 1207 is held in a fixed position by a pair of guide teeth. The wire then is wound around point A' and the process repeats until a design width is reached. Removable braces 1201 are then removed to allow plates 1205 and 1206 to be separated from the wire band. In a subsequent step, the wire band is pressed into the final shape of a coil unit in an apparatus similar to that shown in FIG. 8B.

Figure 13:
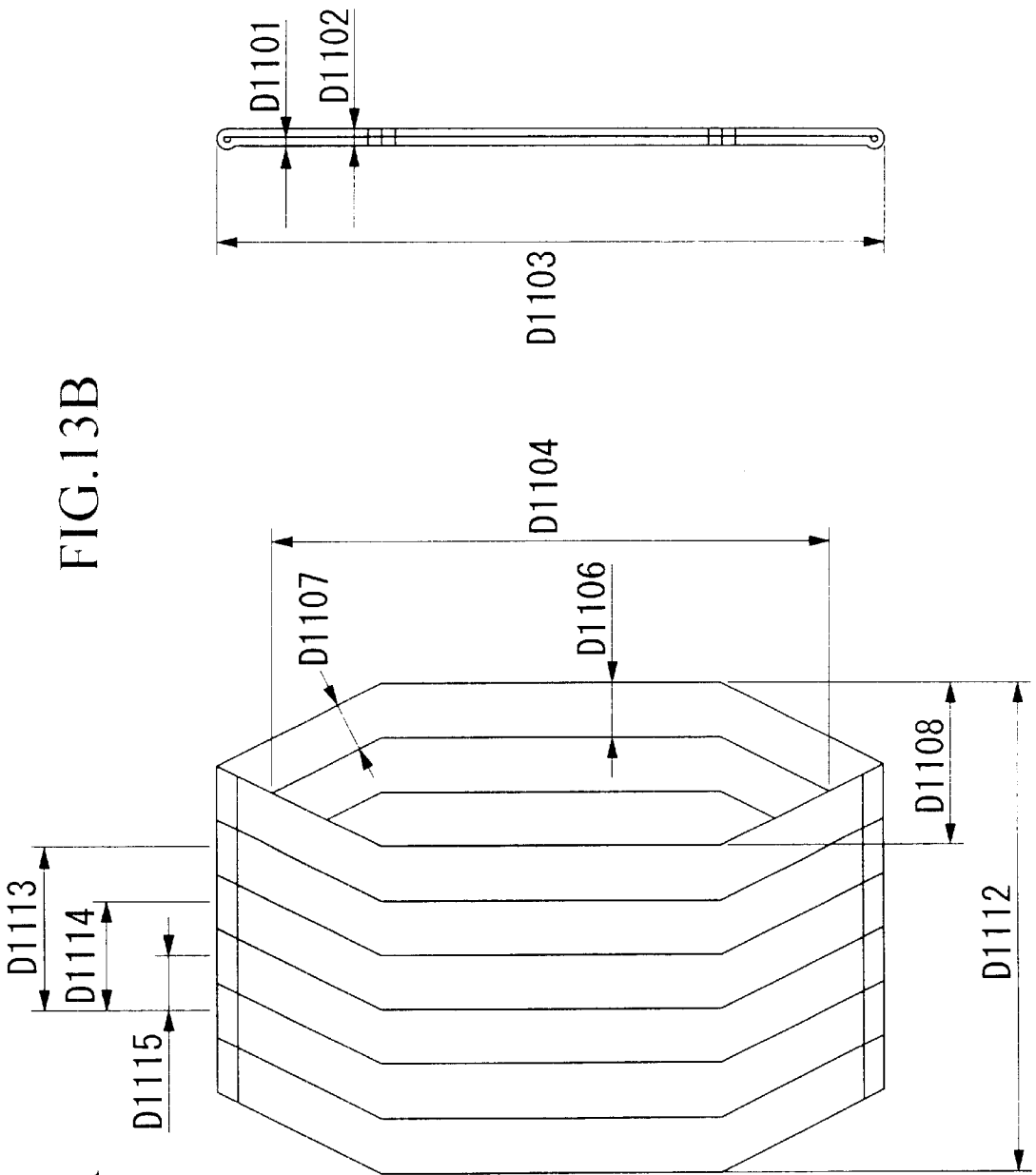
FIGS. 13A and 13B are respectively a plan view and an end view of a linear motor coil suitable for a moving coil linear motor using folded tip hexagonal coil units, according to the invention.

FIGS. 13A (plan view) and 13C (side view) show a linear motor coil using folded tip hexagonal coil units, according to the invention. The coil units are installed in a staggered overlapping configuration to form a coil with a substantially uniform thickness. The coil units are installed in a can of non-magnetic material, e.g., 300 series stainless steel (or aluminum, ceramic, etc.).

Figure 14:
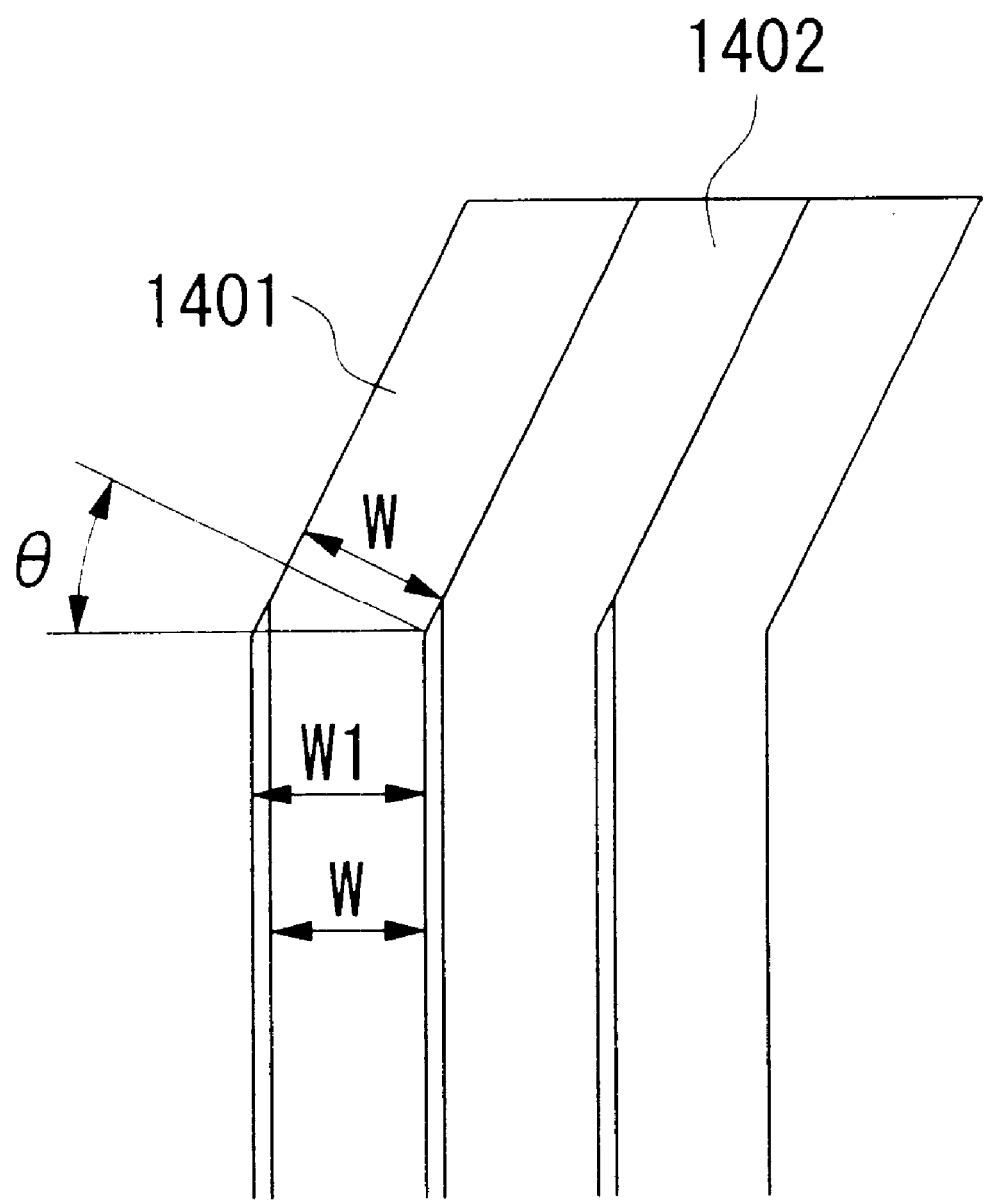
FIG. 14 is a partial plan view of a section of a linear motor coil using tight wound folded tip hexagonal coil units, according to the invention.

One problem in designing a wire band for making a hexagonal coil unit, either a race track type or a folded tip type, is the wire band width. FIG. 14 shows a position of a wire band according to the invention that exemplifies the problem. In FIG. 14, the wire band has a width W. Slanted legs 1401 and 1402 of the coils are stacked closely against each other in order to maximize conductor density. At the parallel leg section, however, the distance between the edges of two neighboring legs is W1. If the angle between the slant leg and the straight leg is Ø, the distance W1 between the two neighboring parallel leg edges is W divided by Ø:

$W1 = W/\cos ∅$

Since cos Ø, is less than 1, W1 is always larger than W. The larger the angle Ø, the larger the distance W1.

Because the distance between the neighboring leg edges is larger than the width of a leg, special winding techniques must be used to assure that a uniform coil thickness is obtained. One arrangement is to use tight wound coil units illustrated in FIG. 14. In FIG. 14, a coil unit is tightly wound so that no space is left between neighboring sections of a wire. The width of the straight leg and that of the slant leg are both equal to W. When the coil units are assembled to form a coil, however, a small gap appears between adjacent straight legs. The width of the gap is W1−W.

Figure 15:
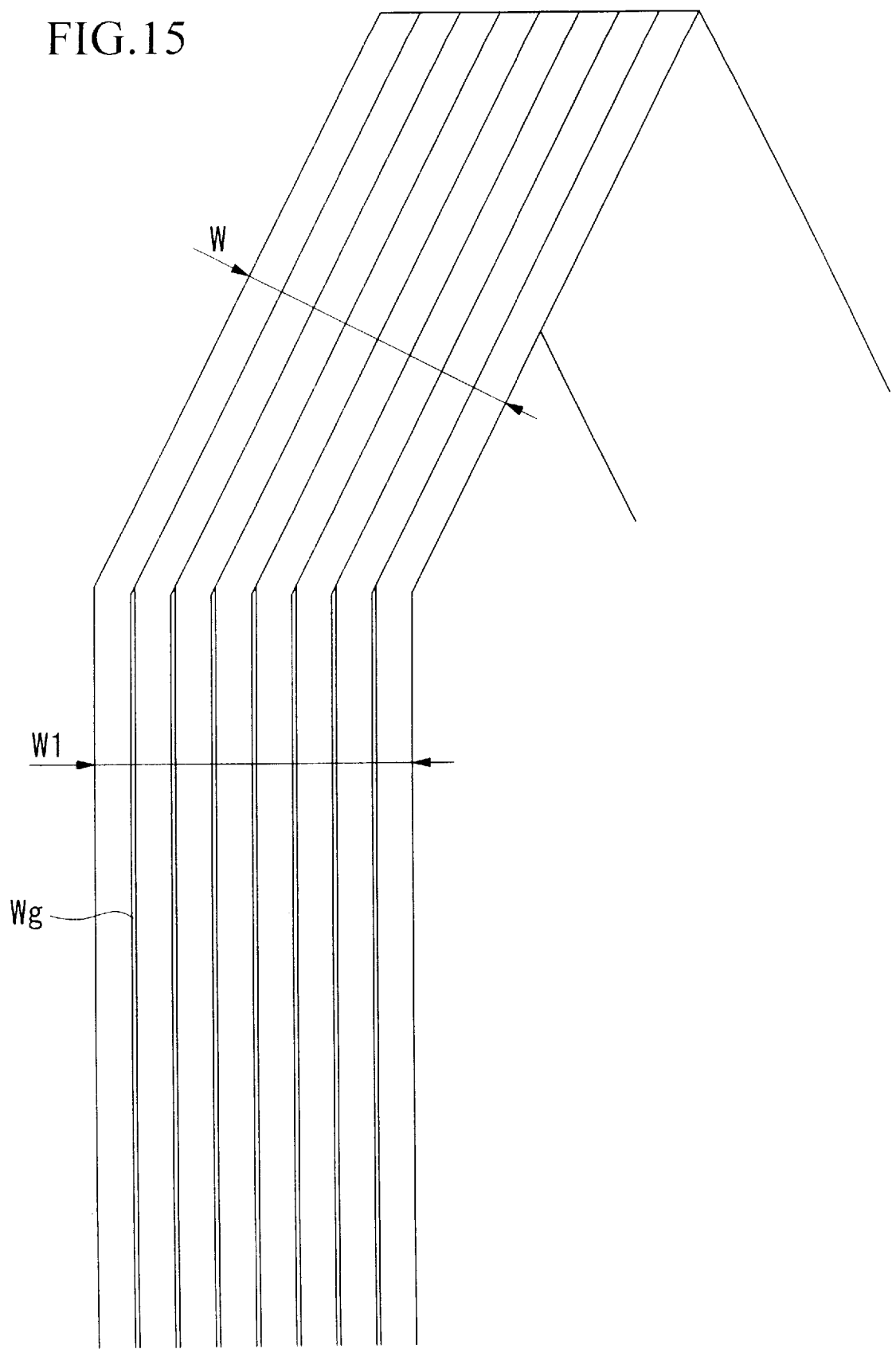
FIG. 15 is a partial plan view of a linear motor coil using loose wound folded tip hexagonal coil units, according to the invention.

Another arrangement is to use the loose wound coil units shown partially in FIG. 15. The extra width W1−W in this type of coil unit is distributed among the neighboring wire sections within the same coil unit. In FIG. 15, each slant leg has a width W, while each straight leg has a width of W1. Each wire section in the slant leg is packed tightly next to the other. In the straight leg section each wire is spaced apart from each other. The width of the gap Wg between one wire section and a neighboring wire section is expressed in the following formula:

$$Wg=(W1-W)/(n-1),$$

where n is the number of wires wound in a wire band. In some embodiments, the above described winding arrangements are used for both the race track type and folded tip type hexagonal coil units.

Referring to FIGS. 11A, 11B, 13A, and 13B, the relevant dimensions of three examples of a motor coil are given in Table 3. Although the motor coil shown in FIG. 13A is a moving coil, a moving magnet motor coil is produced by adding more coil units to the assembly, as shown by the dimensions for one example of a moving magnet motor in Example 3 of Table 3. Illustratively, the length D1112 for the moving magnet motor coil of Example 3 is much larger than for the moving coils of Examples 1 and 2, because there are a larger number of coil units in each row of Example 3. Table 3. Relevant coil dimensions for three examples of a motor coil shown in FIGS. 11A, 11B, 13A, and 13B. Dimensions are in millimeters unless otherwise specified.

| Example No., Motor Type | Example 1, Loose Wound, Moving Coil | Example 2, Tight Wound, Moving Coil | Example 3, Moving Magnet |
| --- | --- | --- | --- |
| Number of Coil Units in a Row | 6 | 6 | 33 |
| D1101 | 1.0 | 1.0 | 1.0 |
| D1102 | 2.0 | 2.0 | 2.0 |
| D1103 | 104 | 104 | 104 |
| D1104 | 87.2 | 87.2 | 87.2 |
| D1105 | 16.67 | 17.55 | 17.55 |
| D1106 | 8.33 | 7.45 | 7.45 |
| D1107 | 7.45 | 7.45 | 7.45 |
| D1108 | 33.33 | 32.45 | 32.45 |
| D1110 (degrees) | 26.6 | 26.6 | 26.6 |
| D1112 coil length | 74.97 | 74.09 | 299 |
| D1113 | 24.99 | 24.99 | 24.99 |
| D1114 | 16.66 | 16.66 | 16.66 |
| D1115 | 8.33 | 8.33 | 8.33 |

Figure 16A:
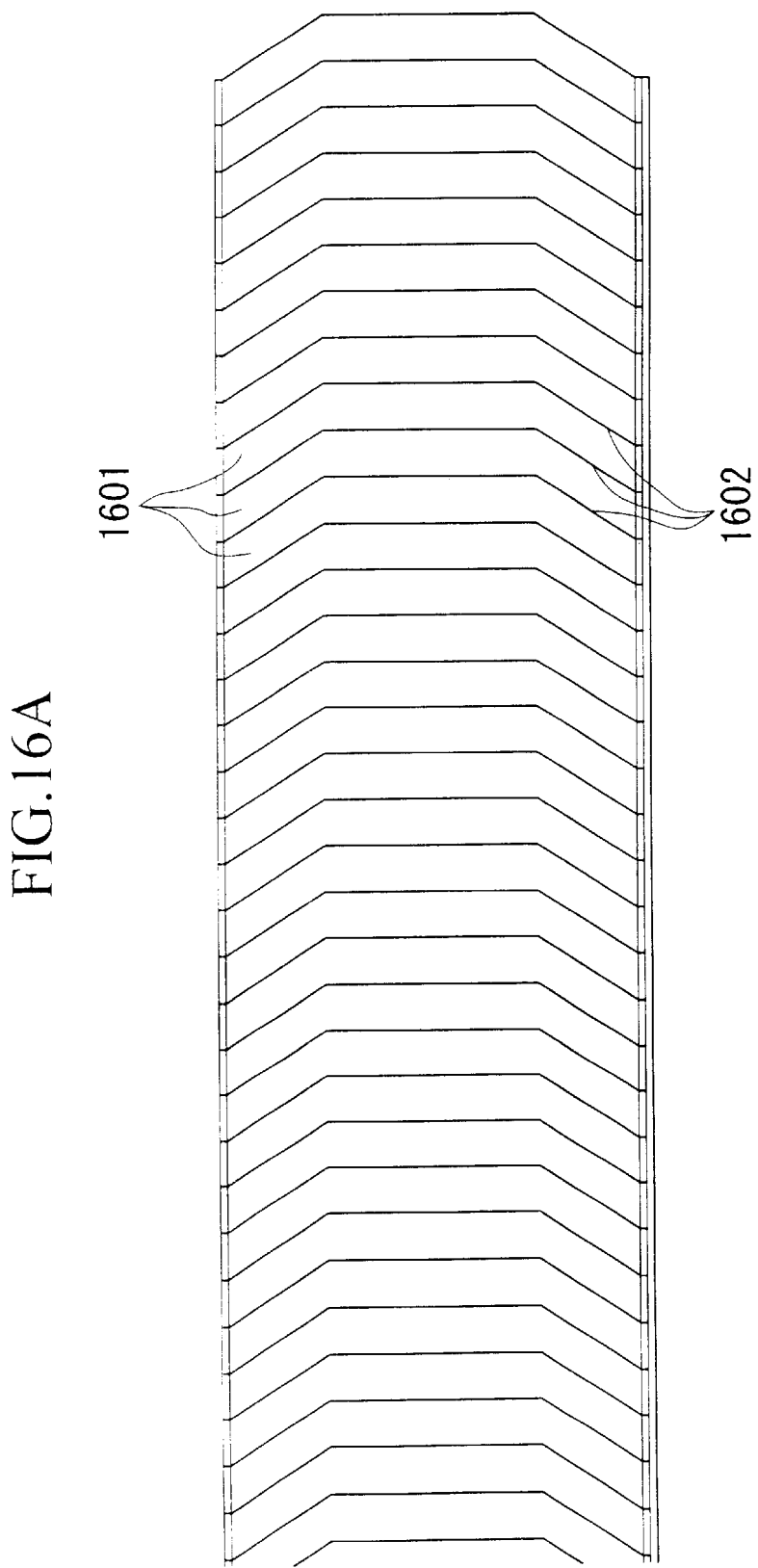
FIG. 16A is a schematic plan view of a row of conductor legs formed on a sheet, of flex circuit, suitable for making hexagonal flex circuit coil units.

Another example of a linear motor according to the invention uses a flex circuit for making a motor coil unit. FIG. 16A shows a row of coil legs for making hexagonal coil units. Partition gaps 1602 are etched on the conductor layer of the flex circuit, leaving coil unit legs 1601 mutually insulated from each other. Flex circuit coils avoid the difficulties associated with band width as described above in connection with FIGS. 14 and 15, because the insulating gaps ate etched onto a single substrate instead of being wound.

Figure 16B:
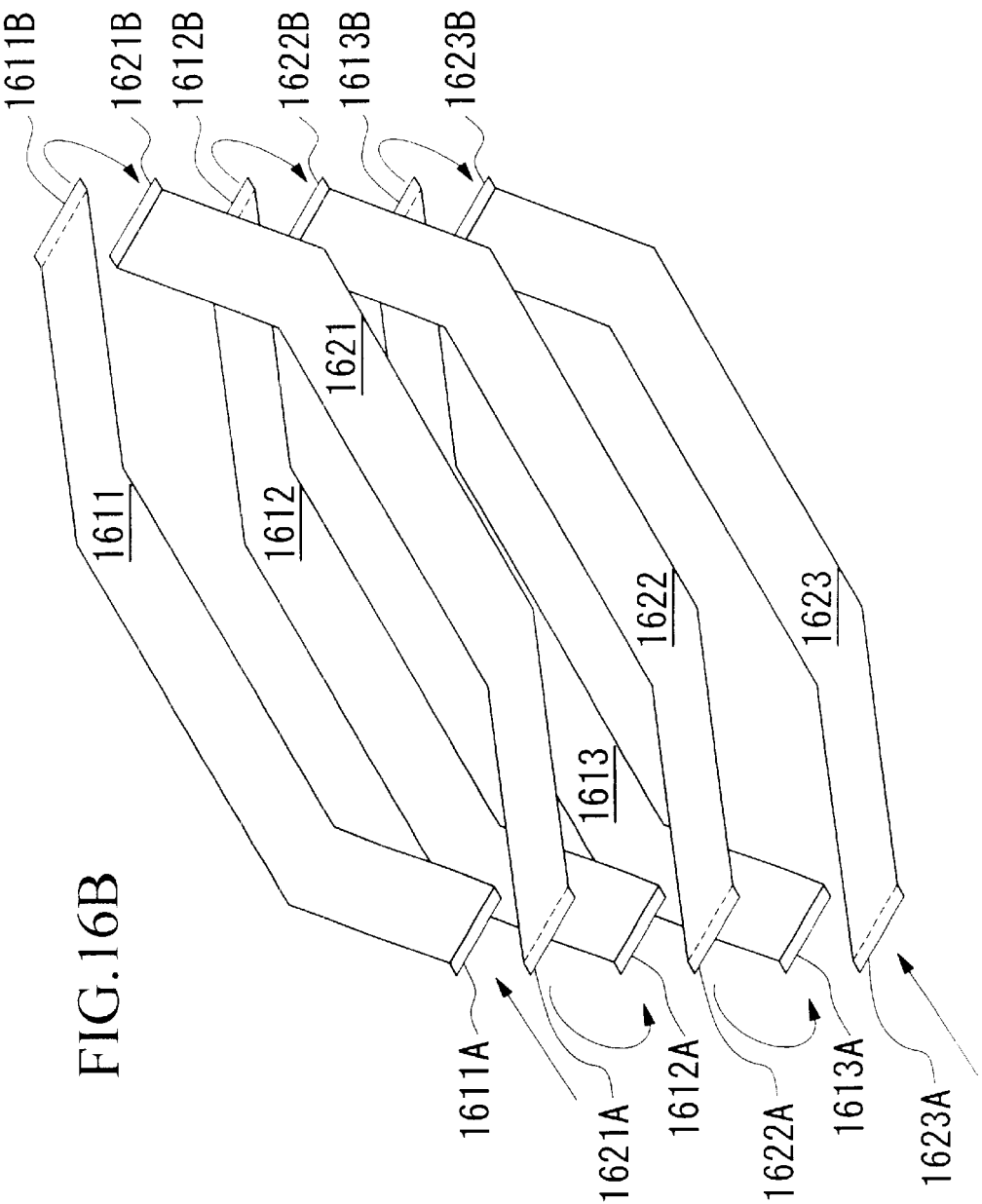
FIG. 16B is a perspective view of a series of hexagonal coil unit legs, illustrating the spatial relationship and the electrical connection among the coil legs.

The conductor layer on a sheet of flex circuit commonly has a small thickness, in the range of a fraction of a millimeter. Thus multiple layers are normally used in a motor coil to generate sufficient Lorentz force. FIG. 16B schematically illustrates the inter-layer electrical connection of a section of coil legs. At coil leg head area 1611A, the insulation layer is shown etched away to expose the conductor layer, and the conductor layer is electrically connected to in outside power supply cable or to a neighboring coil unit through an interconnect (such as interconnect portion 1650 in FIG. 16D). One end of the coil has no insulation on either side; the other end has insulation on one side.

Head area 1611B of leg 1611 is electrically connected to head area 1621B of leg 1621, in which area the insulation layer is similarly etched away. Head area 1621A of leg 1621 is electrically connected to head area 1612A of leg 1612. The other coil leg heads are connected in a similar fashion. In a motor coil connected using this configuration, electric current flows in a spiral fashion from one leg to another leg in the direction indicated by the arrows. The electrical connection is made with solder or other electrically conductive adhesive material, such as electrically conductive epoxy or pressure sensitive tape. In some embodiments, other electrical contacting materials are used. At the last coil leg 1623, the head area 1623A is electrically connected to another coil or to a power supply cable.

FIG. 16C illustrates a cross section of a motor coil where the areas for making the electrical connection are enlarged to show details. Insulation layer 1661 of e.g. polyimide film and conductor layer 1671 of e.g. copper form a first sheet of flex circuit. Insulation layer 1662 and conductor layer 1672 form a second sheet of flex circuit. The other sheets of flex circuits are similar in structure. An extra insulation layer 1668 is provided at the bottom to insulate to the last conductor layer.

Conductor layer 1671 is etched to form a row of coil legs analogous to, for example, leg 1611 of FIG. 16B. Conductor layer 1672 is etched to form a row of coil legs analogous to, for example, leg 1621 of FIG. 16B. At end 1699 and between lines 1693 and 1694, the insulation layer 1662 is etched away to expose conductor layer 1672, to form a leg head area analogous to, for example, head area 1621B of FIG. 16B. Electrical connection is established using electrically conductive material 1681. At end 1698 and between lines 1691 and 1692, insulation layer 1663 is etched away to expose conductor layer 1673. Electrical connection between conductor layers 1672 and 1673 is established using electrically conductive material 1682. Insulation layer 1661 is etched away at end 1698 to expose conductor layer 1671 to form an area 1675, which is analogous to, for example, area 1611A of FIG. 16B. A similar exposed area 1674 is etched on insulation layer 1668 at the opposite side.

Figure 16D:
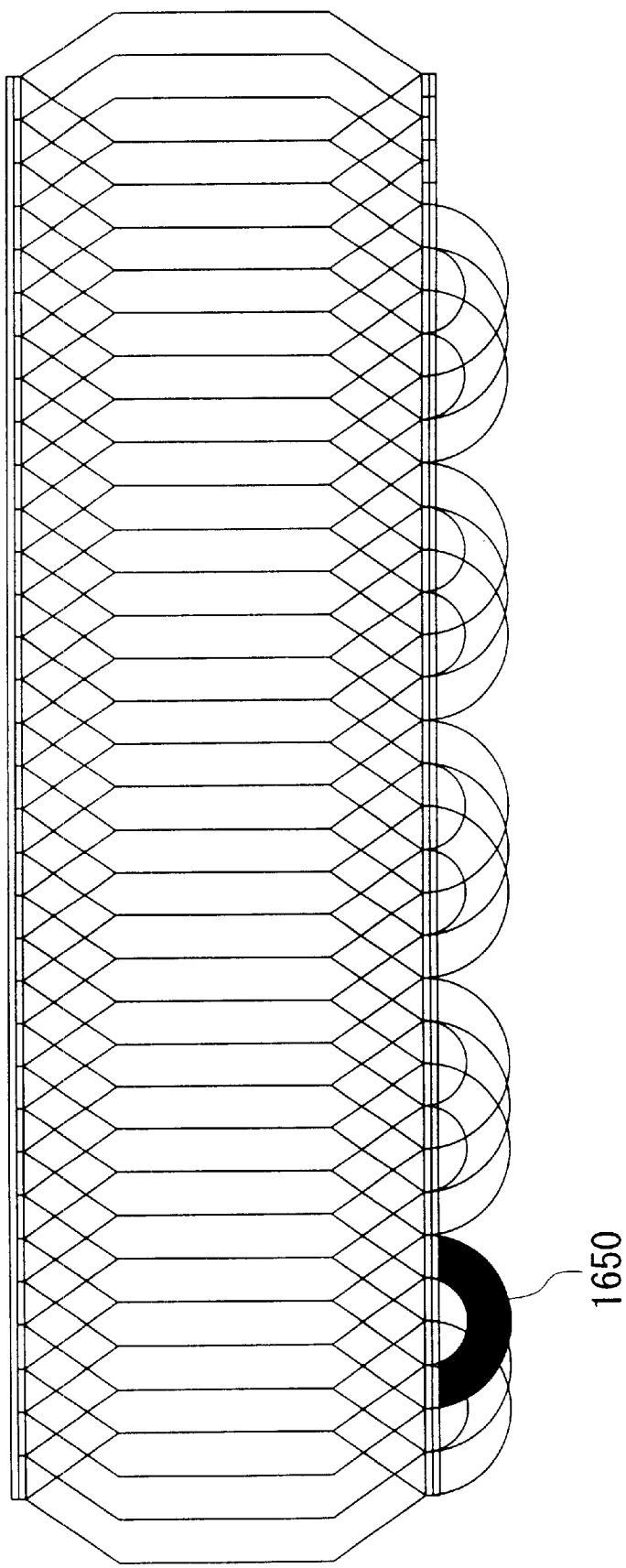
FIG. 16D is a schematic plan view of a linear motor coil made of flex circuit including several layers of coil units, illustrating the electrical connection between different coil units.

FIG. 16D shows a motor coil core after the electrical connection has been established. A series of interconnects, such as interconnect 1650, electrically connects one coil unit to another coil unit of the same phase group.

Figure 17A:
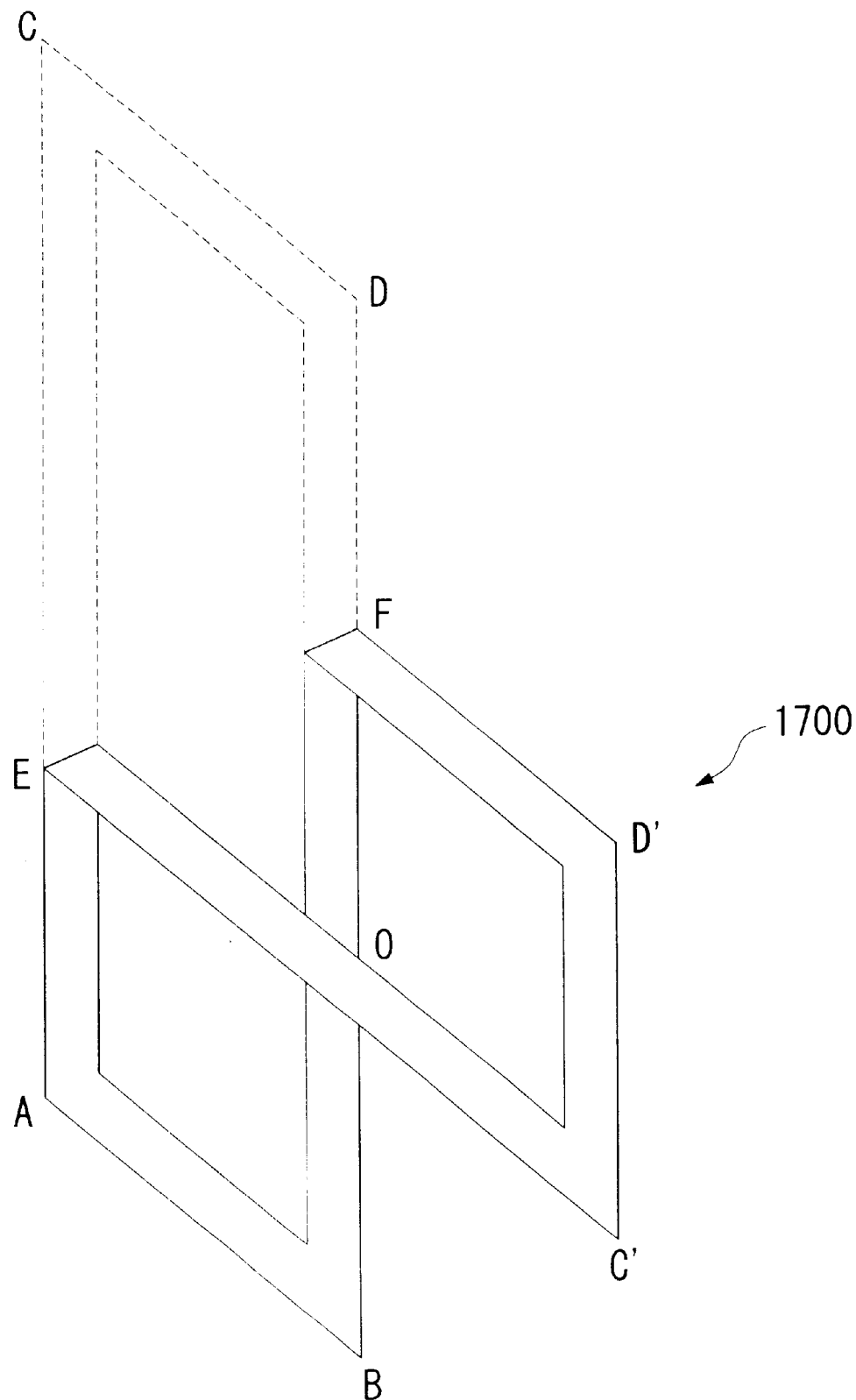
FIG. 17A is a schematic diagram illustrating the formation of a race track double diamond shaped coil unit by folding a parallelogram shaped wire band, according to the invention.

Yet another configuration of a motor coil according to the invention uses double diamond shaped motor coil units as shown in FIG. 17A. Coil unit 1700 has two cross legs C' E and BF intercepting each other at point O. Point O thus divides leg C' E into two equal length sections C' O and EO and divides leg BF into two equal length sections BO and FO. Sections BO and EO and legs AE and AB form one diamond shape, and sections FO and C' O and legs D' F and C' D' form another diamond shape.

One step in making a double diamond shaped coil unit is to form a parallelogram wire band. In some embodiments the parallelogram wire band is a race track type. In some embodiments the parallelogram wire band is a folded tip type. A race track type parallelogram wire band ABDC is shown in FIG. 17A, partially in dashed lines. Parallelogram wire band ABDC is wound so that the length of the two long legs AC and BD is three times the length of the two short legs AB and CD. When parallelogram wire band ABDC is folded at points E and F into a double diamond shaped coil unit 1700 (all solid lines), points C and D become points C' and D' respectively, and legs BF and EC' intersect at Point O. In some embodiments a race track type parallelogram wire band is wound using an apparatus similar to that shown in FIG. 4A, as described above.

Figure 17B:
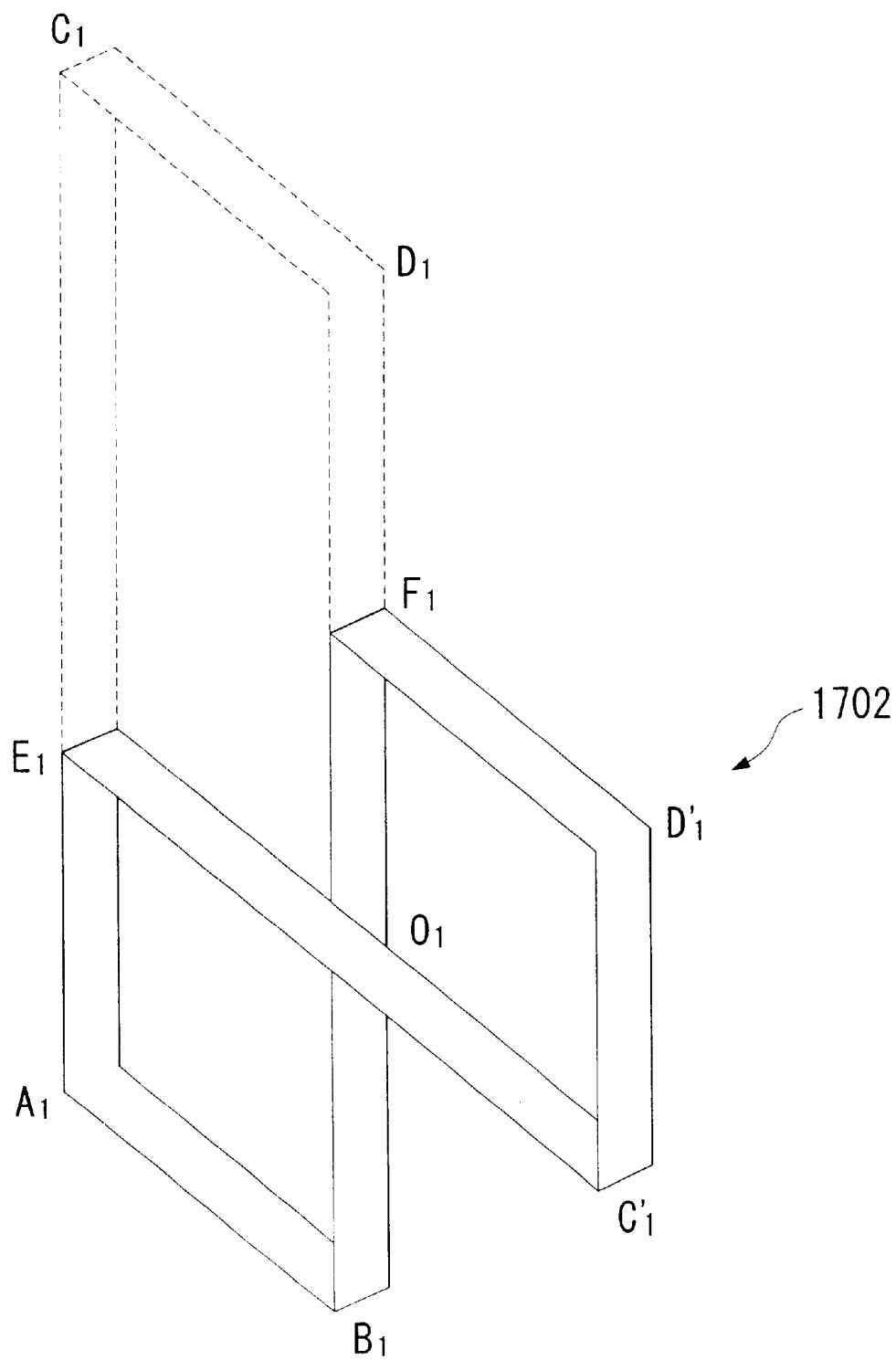
FIG. 17B is a schematic diagram illustrating the formation of a folded tip double diamond shaped coil unit by folding a parallelogram shaped wire band, according to the invention.

FIG. 17B shows a folded tip type parallelogram wire band $A_1B_1D_1C_1$ (partially in dashed lines) having folded tips $B_1$ and $C_1$. When parallelogram wire band $A_1B_1D_1C_1$ is folded at points $E_1$ and $F_1$ into a double diamond shaped coil unit 1702 (all solid lines), points $C_1$ and $D_1$ became points $C_1'$ and $D_1'$ respectively, and legs $B_1F_1$ and $E_1C_1'$ intersect at point $O_1$. In some embodiments an apparatus similar to that shown in either FIG. 8A or FIG. 8B is employed to wind a folded tip parallelogram wire band.

Subsequent to the winding of a wire band, another step in making the double diamond shaped coil unit is to stack a desired number of wire bands in a shingle like relationship. FIG. 18 shows five wire bands 1801, 1802, 1803, 1804, and 1805 stacked together. Since the stacking processes for a race track type and a folded tip type wire bands are similar, FIG. 18 is used to illustrate both types, even though race track type wire bands are shown. Wire band 1804 is stacked partially on top of wire band 1805, and the outside edges of legs 1804C and 1804D are closely against the inside edges of the corresponding legs 1805C and 1805D of wire band 1805. Similarly wire band 1803 is stacked partially on top of wire band 1804, and the outside edges of legs 1803C and 1803D are closely against the inside edges of the corresponding legs 1804C and 1804D. In a similar fashion, wire bands 1802 and 1801 are stacked on. Pressure sensitive tape or an adhesive hold the wire bands together.

Another step in making a motor coil is to fold the stacked parallelogram wire band into a motor coil unit. In FIG. 18, two fold points E and F are chosen for wire band 1801. Fold point E is chosen so that the length of CE is twice the length of AE. Similarly, fold point F is chosen so that the length BF is twice the length FD. Folding points are chosen on each of the wire bands. Because of the uniformity of wire band shape and size, the fold points form a straight line.

Figure 19:
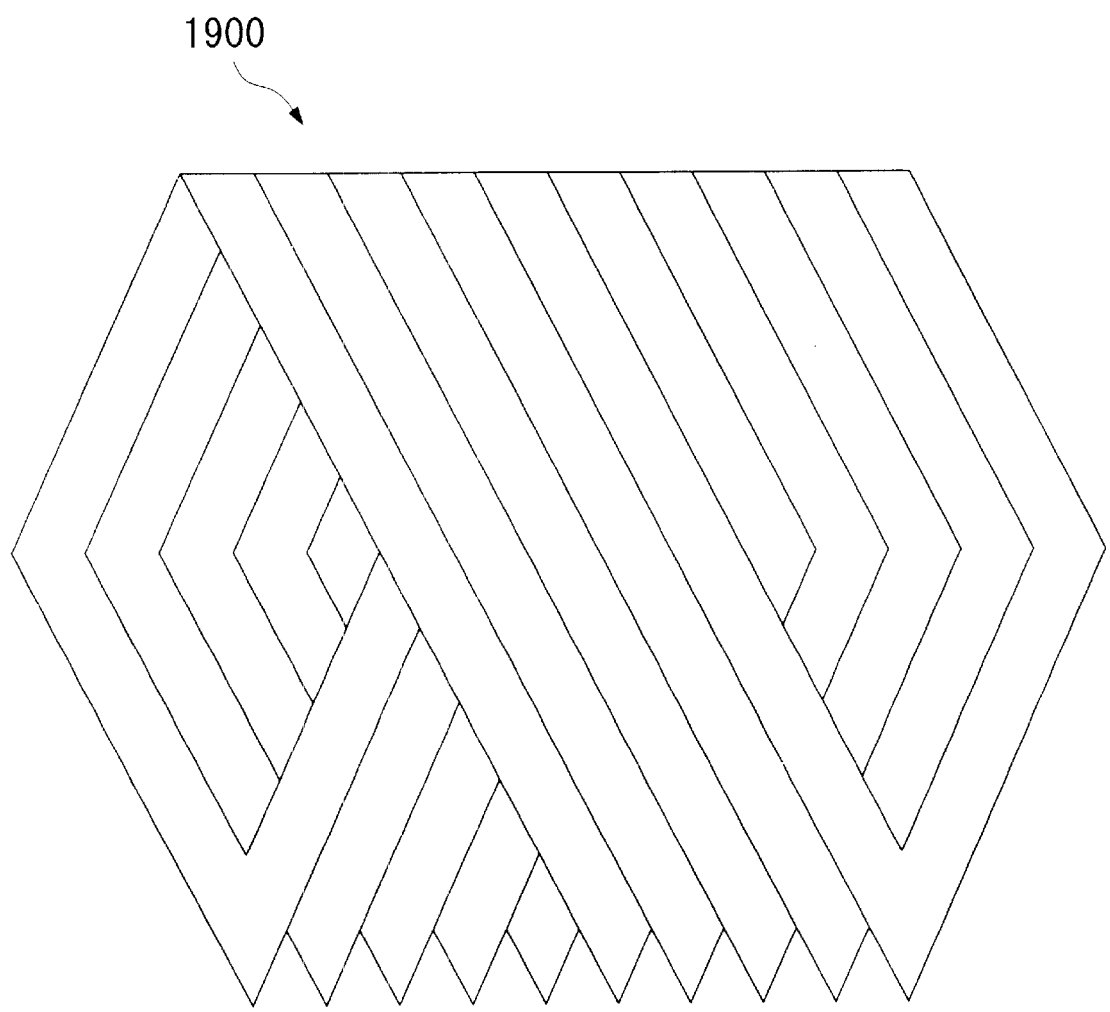
FIG. 19 is a plan view of a row of double diamond shaped coil units formed by folding the row of stacked parallelogram shaped wire bands of FIG. 18, according to the invention.

FIG. 19 shows a row of double diamond shaped coil units 1900 formed of wire bands after the folding process. Rows of linear motor coil units using folded tip wire bands are similar. In some embodiments these rows of coil units are stacked, shingle-like to form longer coils.

In accordance with the invention, it is also possible to make a double diamond shaped coil unit using flex circuit, with the coil wires insulated on both sides.

In some embodiments the rows of motor coil units of any shape described above are used in a single row motor coil configuration. In some embodiments the rows of motor coil units of any shape described above are used in a multi-row motor coil configuration.

Figure 20A:
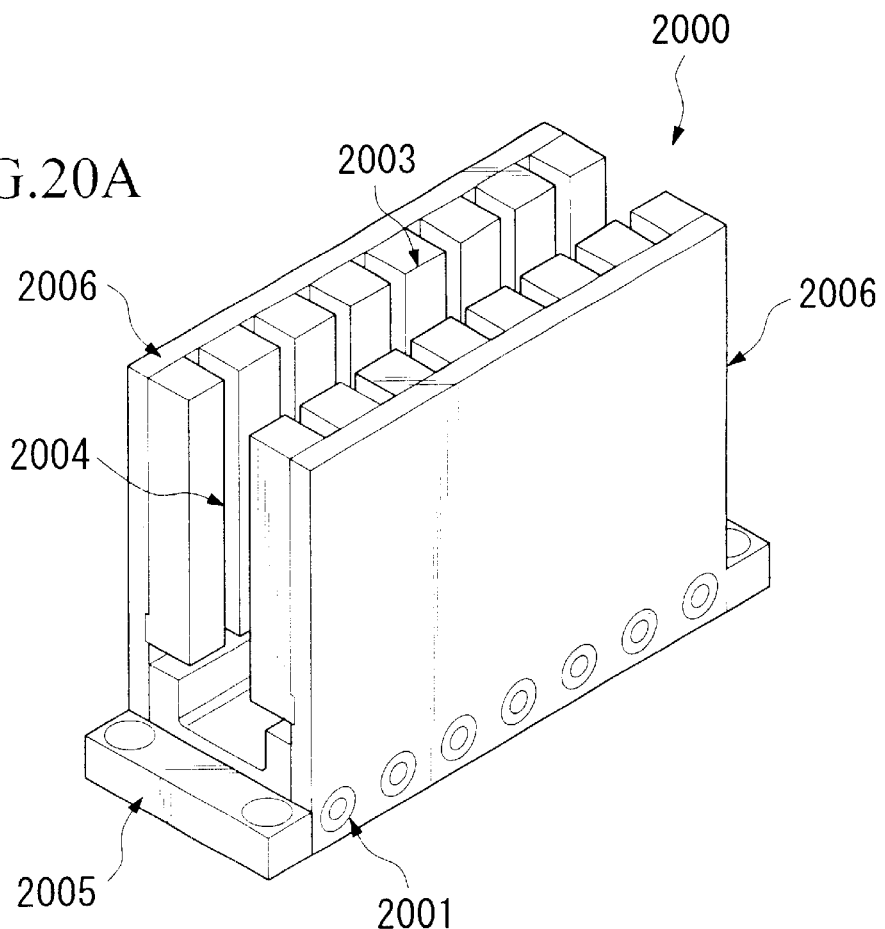
FIG. 20A is a perspective view of a moving magnetic track according to the invention.

FIG. 20A shows a magnetic track 2000 provided for a movable magnet type linear motor according to the invention. Magnetic track 2000 includes rail 2005 and two side rails 2006 attached to rail 2005 by screws 2001 to form a "U" shape. Magnets 2003 and short magnets 2004 are attached to side rails 2006 to form magnet pairs. Magnets of each pair face each other across a gap.

Rail 2005 is of non-magnetic material, such as 304 stainless steel, aluminum or ceramic. Side rails 2006 are of magnetic material (e. g. steel) with saturation flux density equal to or greater than 16,000 gauss. Magnets 2003 and short magnets 2004 are of e.g. high quality NdFeB permanent magnet material with a permanent magnetic flux density of 13,500 or greater gauss. A higher motor constant is obtained if the magnetic flux density is higher. The magnets are coated to prevent corrosion.

Figure 20B:
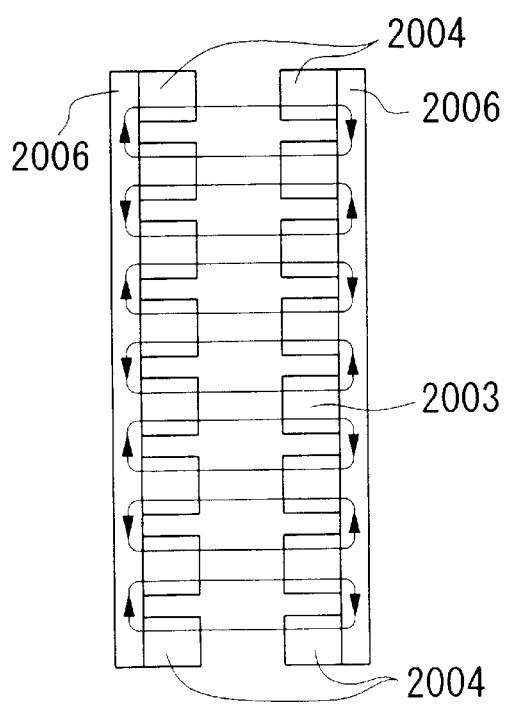
FIG. 20B is a schematic plan view of the magnetic track of FIG. 20A, showing the magnetic flux path, according to the invention.

FIG. 20B shows the arrangement of the magnetic flux path of the magnetic track shown in FIG. 20A. By properly arranging the polarity of the magnets, the magnetic flux across the magnetic track forms closed loops.

Figure 21:
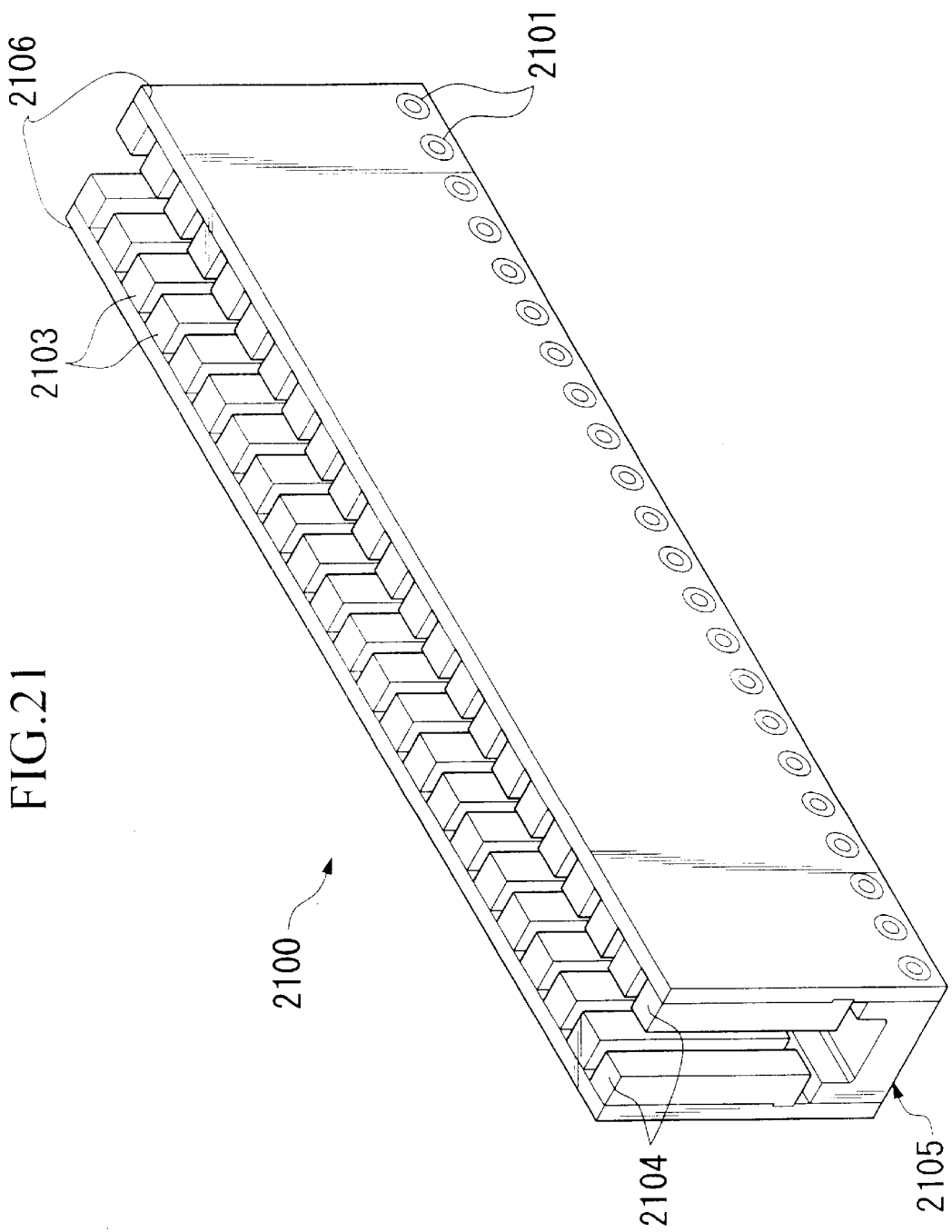
FIG. 21 is a perspective view of a fixed magnetic track suitable for a moving coil linear motor, according to the invention.

FIG. 21 shows a magnetic track 2100 for a moving coil motor according to the invention. Magnetic track 2100 includes rail 2105 and two side rails 2106 attached to rail 2105 by screws 2101 to form a "U" shape. Magnets 2103 and short magnets 2104 are attached to side rails 2106 to form pairs of magnets. Magnets of each pair face each other across a gap. Illustratively, magnetic track 2100 is made of the same materials as magnetic track 2000 in FIG. 20A. As described above, magnetic track 2100 for a moving coil motor is longer than magnetic track 2000 for a moving magnet motor.

Although the present invention is described in terms of several embodiments, these embodiments are illustratively only and do not limit the scope of the invention. Numerous modifications can be made without deviating from the spirit of the invention. For example, although the coil units in the described embodiments contain one layer of wire, coil units in other embodiments contain two or more layers or wire. In some embodiments a coil unit with two layers of wire is formed by stacking one single layer coil unit on top of another single layer coil unit. These and other variations fall within the scope of the invention, which is best defined by the following claims.

Further, the present invention may be applied to a coil unit of a planar motor, for driving a stage by electromagnetic force, in which a magnet unit, having magnets disposed in a two-dimensional array, and an armature unit, having coils disposed in a two-dimensional array, face each other. In this case, one of the magnet unit and the armature unit is connected to the stage, and the other is provided on the movable surface of the stage. The planar motor is disclosed in U.S. Pat. No. 4,654,571, and the present invention can be applied while the structure disclosed in this patent may be modified if necessary.

The coil unit of the present invention can be applied to the shaft-type linear motor disclosed in U.S. Pat. No. 4,460,855. In this case, the present invention can be applied to an armature unit of the motor while the structure disclosed in this patent may be modified if necessary.

Figure 22:
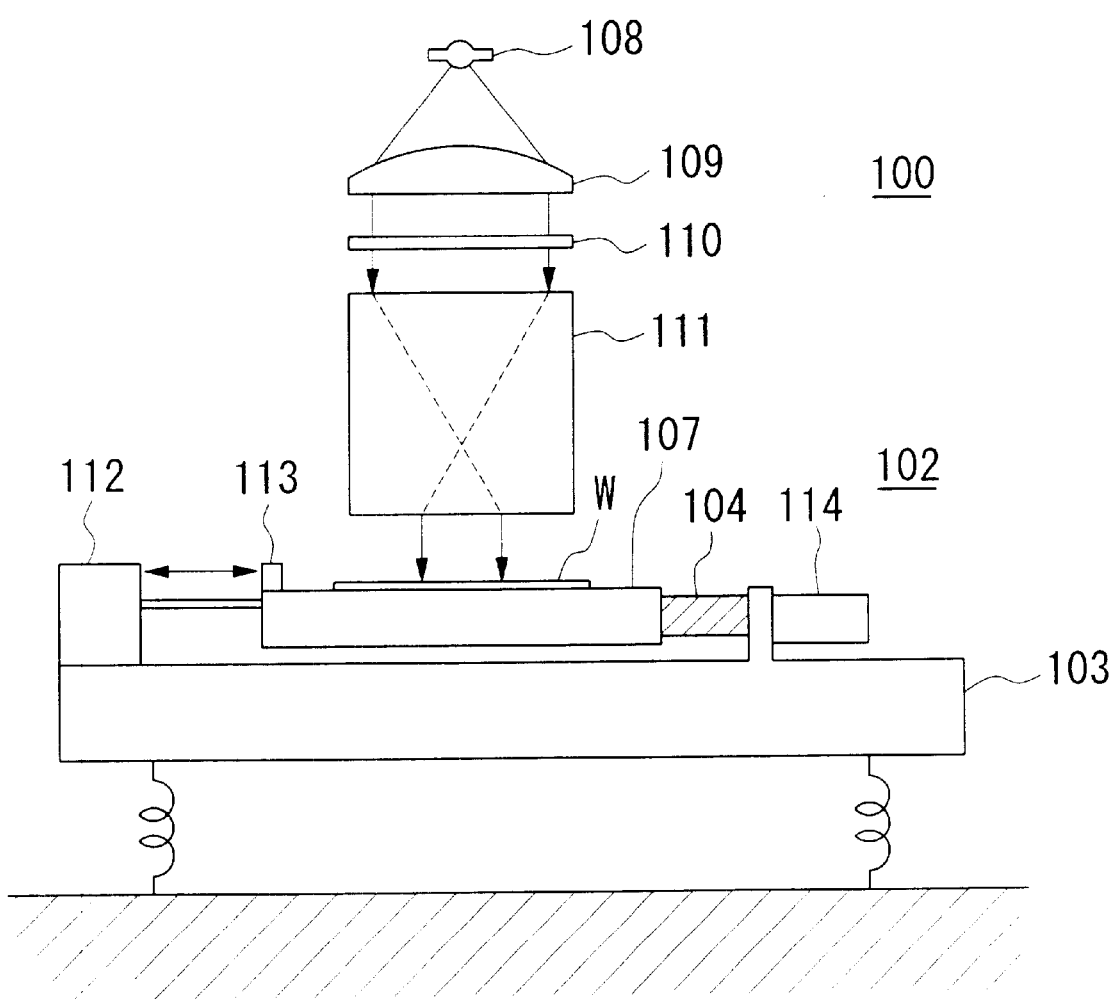
FIG. 22 is a schematic diagram illustrating a projection exposure apparatus for manufacturing a semiconductor device having the linear motor with the moving magnet configuration of the present invention.

FIG. 22 is a schematic diagram illustrating a projection exposure apparatus 100 for manufacturing a semiconductor device having the linear motor with the moving magnet configuration of the present invention. The projection exposure apparatus 100 comprises a vibration-proof base 103 constituting a base, a stage device 102 provided on the vibration-proof base 103, a light source 108, an illumination optical system 109, a reticle stage 110, a projection lens 111, an interferometer 112. The stage device 102 has a linear motor 104, and a table (substrate stage) 107 which serves as a mounting base for mounting a wafer (substrate) W which is a photosensitive substrate. A stage controller 114 controls the linear motor 104 so as to move the table 107, which is guided by a guiding mechanism (not shown) such as an air bearing, to a predetermined position. The illumination optical system 109 comprises a lens system such as a fly eye lens, or a condenser lens, and acts as a secondary light source.

In the projection exposure apparatus 100, the light is emitted from the light source 108 to a specified photosensitive region on the wafer W surface, and is focused via the illumination optical system 109, the reticle (mask) placed on the reticle stage 110, and the projection lens system 111, to the wafer W. Thus, a predetermined mask pattern is formed on the wafer W.

The interferometer 112 measures the position of the table 107, based on the light reflected from a movable mirror 113 provided on the table 107, and outputs the results to the stage controller 114. After the completion of the projection and exposure of the exposure region, the linear motor 104 is driven to move the table 107 by the stage controller 114, based on the output from the interferometer 112, so that the next exposure region is set to a specified position within the projection field of the projection lens 111.

The exposure apparatus of the present invention is applied to a scanning type exposure apparatus (e.g., U.S. Pat. No. 5,473,410) which simultaneously moves a mask (reticle) and a substrate (wafer) to expose a pattern of the mask. In this case, the linear motor shown in FIG. 22 is used as the driving source for the mask stage for moving the mask. Further, in addition to the scanning type exposure apparatus, the present invention can be applied to a step-and-repeat type exposure apparatus which exposes a mask and pattern with the mask and substrate in a stationary condition, sequentially stepping the substrate.

Further, the present invention can be applied to a proximity exposure apparatus which does not use a projection optical system, but locates the mask and substrate close together and exposes the pattern of the mask.

Moreover, use of the exposure apparatus, is not limited to the exposure apparatus used for semiconductor manufacture. For example, this can be widely applied to liquid crystal exposure apparatus which expose liquid crystal display device patterns on a rectangular glass plate, or in exposure apparatus for the manufacture of thin film magnetic heads.

For the light source of the exposure apparatus, not only can a g-line (436 nm) and i-line (365 nm), a KrF excimer laser (248 nm), an ArF excimer laser (193nm), a $F_2$ laser (157nm) be used, but also a charged particle beam such as an X-ray or electron beam may be used. For example, when an electron beam is used, a thermionic emission type lanthanum hexaborane ($LaB_6$) or tantalum (Ta) electron gun may be used for the electron gun.

When the exposure apparatus uses an electron gun, the present invention can be applied to both a system using a mask, and a direct draw system which does not use a mask.

Regarding the magnification of these projection optical systems, these may be not only reduction systems but may also be equal magnification and enlargement systems.

For the projection optical system (which contains the illumination optical system for irradiation), when far ultraviolet radiation such as with an excimer laser is used, a glass material which transmits far ultraviolet radiation such as quartz or fluorite is used. When an $F_2$ laser or an X-ray is used, a reflection/refraction system or refraction system optical system (the reticle also uses a reflecting type) is used. Moreover, when an electron beam is used, an electrooptical system comprising an electrooptic lens and a deflector may be used for the optical system. Here needless to say, the optical path along which the electron beam passes is evacuated.

When the linear motor is used for the driving source for the substrate stage (stage device) or the mask stage, an air levitation type using an air bearing, or a magnetic levitation type using Lorentz force or reactance force can be employed. Moreover, the stage may be moved along a guide, and a guide-less type which does not have a guide may be employed.

The reaction force produced by the movement of the substrate (wafer) stage may be mechanically released to the floor (ground) by frame members, as disclosed in Japanese Unexamined Patent Application, First Publication No. Hei 8-166475 (U.S. Pat. No. 5,528,118).

The reaction force produced by the movement of the mask (reticle) stage may be mechanically released to the floor (ground) by frame members, as disclosed in Japanese Unexamined Patent Application, First Publication No. Hei 8-330224 (U.S. Ser. No. 08/416,558).

The exposure apparatus of the embodiment of the present invention is manufactured by assembling sub-systems which contains structural elements described in claims with specified machine accuracy, electric accuracy, and optical accuracy. To ensure the accuracy, before and after the assembling process, the optical system is coordinated to achieve the optical accuracy, the mechanical system is coordinated to achieve the machine accuracy, and the electric system is coordinated to achieve the electric accuracy. The process for assembling the various sub-systems to manufacture the exposure apparatus includes connecting mechanical parts, connecting electric circuits, and connecting pipes of pressure circuits, between the sub-systems. Needless to say, before the assembling of the sub-systems for constructing the exposure apparatus, the respective sub-systems must be assembled. When the assembling of the sub-systems for constructing the exposure apparatus is completed, the apparatus is totally coordinated to ensure the accuracy of the entire exposure apparatus. Preferably, the exposure apparatus is manufactured in a clear room whose temperature and extent of cleanness are managed.

The semiconductor device is manufactured by steps of: designing the function and performance of the device, producing a reticle, based on the designing step, producing a wafer from silicon material, exposing the pattern of the reticle on the wafer by the exposure apparatus of the above-described embodiment, assembling the device (which includes a dicing step, a bonding step, and a packaging step), and inspecting step.

What is claimed is:

1. A stage device having a base, a mounting base which is movable relative to said base, and a driving device for driving said mounting base, wherein said driving device employs an electric motor as a part of a driving source, and said electric motor comprises:

at least one magnet; and a motor coil operating in cooperation with said at least one magnet and having at least one coil unit comprising an electrical conductor, said electrical conductor comprising a first sheet and a second sheet of laminar material, each of said sheets including a plurality of substantially coplanar electrically conductive members bonded to a substantially planar electrically insulating substrate, at least one of said conductive members of said first sheet being joined to at least one of said conductive members of said second sheet.

2. An exposure apparatus for forming a specified image on a substrate mounted on a substrate stage, wherein
an electric motor is employed as a part of a driving source for driving said substrate stage, and
said electric motor comprises:
at least one magnet; and
a motor coil operating in cooperation with said at least one magnet and having at least one coil unit comprising an electrical conductor, said electrical conductor comprising a first sheet and a second sheet of laminar material, each said sheet including a plurality of substantially coplanar electrically conductive members bonded to a substantially planar electrically insulating substrate, at least one of said conductive members of said first sheet being joined to at least one of said conductive members of said second sheet.

3. An exposure apparatus for transferring a pattern, formed on a mask mounted on a mask stage, onto a substrate mounted on a substrate stage, wherein
an electric motor is employed as a part of a driving source for driving at least one of said mask stage and said substrate stage, and
said electric motor comprises:
at least one magnet; and
a motor coil operating in cooperation with said at least one magnet and having at least one coil unit comprising an electrical conductor, said electrical conductor comprising a first sheet and a second sheet of laminar material, each of said sheets including a plurality of substantially coplanar electrically conductive members bonded to a substantially planar electrically insulating substrate, at least one of said conductive members of said first sheet being joined to at least one of said conductive members of said second sheet.

4. A stage device having a base, a mounting base which is movable relative to said base, and a driving device for driving said mounting base, wherein said driving device employs a linear motor as a part of a driving source, and said linear motor comprises:
a linear motor coil, operable in cooperation with an associated magnet track, comprising: a plurality of coil units, each said coil unit configured into a geometric polygonal shape defining a substantially planar band surrounding a void, and wherein said plurality of coil units are arranged linearly, each said coil unit comprises a first sheet and a second sheet, said void is defined by said first sheet and said second sheet surrounding said void, each said sheet including a plurality of substantially coplanar electrically conductive members bonded to a substantially planar electrically insulating substrate, at least one said conductive member of said first sheet being joined to at least one said conductive member of said second sheet.

5. A stage device having a base, a mounting base which is movable relative to said base, and a driving device for driving said mounting base, wherein said driving device employs a linear motor as a part of a driving source, and said linear motor comprises:
a magnet track; and
a motor coil operating in cooperation with said magnet track and having a plurality of coil units, each said coil unit configured into a geometric polygonal shape defining a substantially planar band surrounding a void, and wherein said plurality of coil units are arranged linearly, each said coil unit comprises a first sheet and a second sheet of laminar material, and said void is defined by said first sheet and said second sheet surrounding said void, each said sheet including a plurality of substantially coplanar electrically conductive members bonded to a substantially planar electrically insulating substrate, at least one said conductive member of said first sheet being joined to at least one said conductive member of said second sheet.

6. A stage device having a base, a mounting base which is movable relative to said base, and a driving device for driving said mounting base, wherein said driving device employs a linear motor as a part of a driving source, and said linear motor comprises:
a motor coil operable in cooperation with an associated magnet track, comprising: a plurality of coil units, each said coil unit configured into a geometric polygonal shape defining a substantially planar band surrounding a void, wherein each said coil unit comprises a plurality of sheets of laminar material layered on each other, each said sheet including a plurality of substantially coplanar electrically conductive member bonded to a substantially planar electrically insulating member, and said plurality of coil units are arranged linearly substantially along the direction of a driving force of the linear motor.

7. A stage device having a base, a mounting base which is movable relative to said base, and a driving device for driving said mounting base, wherein said driving device employs a linear motor as a part of a driving source, and said linear motor comprises:
a magnet track; and
a motor coil operating in cooperation with said magnet track and having a plurality of coil units, each said coil unit configured into a geometric polygonal shape defining a substantially planar band surrounding a void, wherein each said coil unit comprises a plurality of sheets of laminar material layered on each other, each said sheet including a plurality of substantially coplanar electrically conductive members bonded to a substantially planar electrically insulating member, and said plurality of coil units are arranged linearly substantially along the direction of a driving force of the linear motor.

8. An exposure apparatus for forming a specified image on a substrate mounted on a substrate stage, wherein a linear motor is employed as a part of a driving source for driving said substrate stage, and said linear motor comprises:
a linear motor coil, operable in cooperation with an associated magnet track, comprising: a plurality of coil units, each coil unit configured into a geometric polygonal shape defining a substantially planar band surrounding a void, and wherein said plurality of coil units are arranged linearly, each said coil unit comprises a first sheet and a second sheet, said void is defined by said first sheet and said second sheet surrounding said void, each said sheet including a plurality of substantially coplanar electically conductive members bonded to a substantially planar electrically insulating substrate, at least one said conductive member of said first sheet being joined to a least one said conductive member of said second sheet.

9. An exposure apparatus for forming a specified image on a substrate mounted on a substrate stage, wherein a linear motor is employed as a part of a driving source for driving said substrate stage, and said linear motor comprises:

a magnet track; and a motor coil operating in cooperation with said magnet track and having a plurality of coil units, each said coil unit configured into a geometric polygonal shape defining a substantially planar band surrounding a void, and wherein said plurality of coil units are arranged linearly, each said coil unit comprises a first sheet and a second sheet of laminar material, said void is defined by said first sheet and said second sheet surrounding said void, each said sheet including a plurality of substantially coplanar electrically conductive members bonded to a substantially planar electrically insulating substrate, at least one said conductive member of said first sheet being joined to a least one said conductive member of said second sheet.

10. An exposure apparatus for forming a specified image on a substrate mounted on a substrate stage, wherein a linear motor is employed as a part of a driving source for driving said substrate stage, and said linear motor comprises:

a motor coil operable in cooperation with an associated magnet track, comprising: a plurality of coil units, each said coil unit configured into a geometric polygonal shape defining a substantially planar band surrounding a void, wherein each said coil unit comprises a plurality of sheets of laminar material layered on each other, each said sheet including a plurality of substantially coplanar electrically conductive members bonded to a substantially planar electrically insulating member, and said plurality of coil units are arranged linearly substantially along the direction of a driving force of the linear motor.

11. An exposure apparatus for forming a specified image on a substrate mounted on a substrate stage, wherein a linear motor is employed as a part of a driving source for driving said substrate stage, and said linear motor comprises:

a magnet track; and a motor coil operating in cooperation with said magnet track and having a plurality of coil units, each said unit configured into a geometric polygonal shape defining a substantially planar band surrounding a void, wherein each said coil unit comprises a pluraltiy of sheets of laminer material layered on each other, each said sheet including a plurality of substantially coplanar electrically conductive members bonded to a substantially planar electrically insulating member, and said plurality of coil units are arranged linearly substantially along the direction of a driving force of the linear motor.

12. An exposure apparatus for transferring a pattern, formed on a mask mounted on a mask stage, onto a substrate mounted on a substrate stage, wherein a linear motor is employed as a part of a driving source for driving at least one of said mask stage and said substrate stage, and said linear motor comprises:

a linear motor coil, operable in cooperation with an associated magnet track, comprising: a plurality of coil units, each said coil unit configured into a geometric polygonal shape defining a substantially planar band surrounding a void, and wherein said plurality of coil units are arranged linearly, each said coil unit comprises a first sheet and a second sheet, said void is defined by said first sheet and said second sheet surrounding said void, each said sheet including a plurality of substantially coplanar electrically conductive members bonded to a substantially planar electrically insulating substrate, at least one said conductive member of said first sheet being joined to at least one said conductive member of said second sheet.

13. An exposure apparatus for transferring a pattern, formed on a mask mounted on a mask stage, onto a substrate mounted on a substrate stage, wherein a linear motor is employed as a part of a driving source for driving at least one of said mask stage and said substrate stage, and said linear motor comprises:

a magnet track; and a motor coil operating in cooperation with said magnet track and having a plurality of coil units, each said coil unit configured into a geometric polygonal shape defining a substantially planar band surrounding a void, and wherein said plurality of coil units are arranged linearly, each said coil unit comprises a first sheet and a second sheet of laminar material, said void is defined by said first sheet and said second sheet surrounding said void, each said sheet including a plurality of substantially coplanar electrically conductive members bonded to a substantially planar electrically insulating substrate, at least one said conductive member of said first sheet being joined to at least one said conductive member of said second sheet.

14. An exposure apparatus for transferring a pattern, formed on a mask mounted on a mask stage, onto a substrate mounted on a substrate stage, wherein a linear motor is employed as a part of a driving source for driving at least one of said mask stage and said substrate stage, and said linear motor comprises:

a motor coil operable in cooperation with an associated magnet track, comprising: a plurality of coil units, each said coil unit configured into a geometric polygonal shape defining a substantially planar band surrounding a void, wherein each said coil unit comprises a plurality of sheets of laminar material layered on each other, each said sheet including a plurality of substantially coplanar electrically conductive members bonded to a substantially planar electrically insulating member, and said plurality of a coil units are arranged linearly substantially along the direction of a driving force of the linear motor.

15. An exposure apparatus for transferring a pattern, formed on a mask mounted on a mask stage, onto a substrate mounted on a substrate stage, wherein a linear motor is employed as a part of a driving source for driving at least one of said mask stage and said substrate stage, and said linear motor comprises:

a magnet track; and a motor coil operating in cooperation with said magnet track and having a plurality of coil units, each said coil unit configured into a geometric polygonal shape defining a substantially planar band surrounding a void, wherein each said coil unit comprises a plurality of sheets of laminar material layered on each other, each said sheet including a plurality of substantially coplanar electrically conductive members bonded to a substantially planar electrically insulating member, and said plurality of coil units are arranged linearly substantially along the direction of a driving force of the linear motor.

\* \* \* \* \*